US008575280B2

(12) United States Patent
Uchida et al.

(10) Patent No.: US 8,575,280 B2
(45) Date of Patent: Nov. 5, 2013

(54) THERMOSETTING RESIN COMPOSITION, THERMOSETTING RESIN COMPOSITION SOLUTION, FILM FORMING MATERIAL AND THEIR CURED PRODUCT

(75) Inventors: Hiroshi Uchida, Kawasaki (JP); Ritsuko Azuma, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 1013 days.

(21) Appl. No.: 12/095,990

(22) PCT Filed: Dec. 7, 2006

(86) PCT No.: PCT/JP2006/324887
§ 371 (c)(1),
(2), (4) Date: Jun. 3, 2008

(87) PCT Pub. No.: WO2007/066816
PCT Pub. Date: Jun. 14, 2007

(65) Prior Publication Data
US 2009/0171015 A1 Jul. 2, 2009

(30) Foreign Application Priority Data
Dec. 8, 2005 (JP) ................. 2005-355189

(51) Int. Cl.
*C08G 18/42* (2006.01)
*C08G 18/44* (2006.01)
*C08G 18/48* (2006.01)
*C08G 18/61* (2006.01)
*C08G 18/62* (2006.01)

(52) U.S. Cl.
USPC ........... 525/454; 525/123; 525/127; 525/130; 525/131; 525/455; 525/476; 525/528; 525/529; 525/530; 525/532; 528/28; 528/49; 528/59; 528/65; 528/66; 528/69; 528/73; 528/76; 528/80; 528/85

(58) Field of Classification Search
USPC ......... 525/123, 127, 130, 131, 454, 455, 528; 525/529, 530, 532; 528/49, 59, 65, 69, 66, 528/73, 76, 80, 85, 75
See application file for complete search history.

(56) References Cited

U.S. PATENT DOCUMENTS

| 4,083,815 | A | * | 4/1978 | Thompson | .................... | 524/290 |
| 4,263,188 | A | * | 4/1981 | Hampton et al. | ............. | 523/181 |
| 4,576,726 | A | | 3/1986 | Watanabe et al. | | |
| 6,254,937 | B1 | * | 7/2001 | Schafheutle et al. | ...... | 427/388.2 |
| 7,476,484 | B2 | | 1/2009 | Sailer et al. | | |
| 7,741,411 | B2 | * | 6/2010 | Uchida et al. | .................. | 525/454 |
| 7,951,868 | B2 | * | 5/2011 | Uchida et al. | .................. | 524/590 |
| 2004/0002561 | A1 | * | 1/2004 | Saeki et al. | .................... | 524/284 |
| 2006/0276589 | A1 | * | 12/2006 | Kato et al. | ..................... | 525/185 |
| 2009/0082518 | A1 | * | 3/2009 | Uchida et al. | .................. | 524/539 |
| 2009/0099283 | A1 | * | 4/2009 | Ishihara et al. | ............... | 524/107 |
| 2009/0118422 | A1 | * | 5/2009 | Uchida et al. | .................. | 524/590 |
| 2009/0133905 | A1 | * | 5/2009 | Kimura et al. | ................. | 174/254 |
| 2009/0136732 | A1 | * | 5/2009 | Uchida et al. | .................. | 428/220 |
| 2011/0272182 | A1 | * | 11/2011 | Ooga et al. | ..................... | 174/254 |
| 2011/0272183 | A1 | * | 11/2011 | Ooga et al. | ..................... | 174/254 |

FOREIGN PATENT DOCUMENTS

| EP | 0 542 160 A1 | 5/1993 |
| JP | 59-174660 A | 10/1984 |
| JP | 60-166316 A | 8/1985 |
| JP | 02-278511 A | 11/1990 |
| JP | 2004-137370 A | 5/2004 |
| TW | 200523285 | 7/2005 |
| WO | 02/094956 A1 | 11/2002 |
| WO | WO 2004/094545 A1 * | 11/2004 |
| WO | 2006/033439 A1 | 3/2006 |
| WO | 2006/123804 A1 | 11/2006 |

* cited by examiner

Primary Examiner — Rabon Sergent
(74) Attorney, Agent, or Firm — Sughrue Mion, PLLC

(57) ABSTRACT

Disclosed is a thermosetting resin composition including; (A) a carboxyl group-containing polyurethane prepared by using (a) a polyisocyanate compound (b) polyol compounds (c) a carboxyl group-containing dihydroxy compound as raw materials, (B) a curing agent, wherein the polyol compounds (b) are one or more kinds of polyol compound(s) selected from Group (I) and one or more kinds of polyol compound(s) selected from Group (II); Group I: polycarbonate polyol, polyether polyol, polyester polyol, and polylactone polyol, Group II: polybutadiene polyol, polysilicone having terminal hydroxyl groups, and such a polyol that has 18 to 72 carbon atoms and oxygen atoms present only in hydroxyl groups. The thermosetting resin composition can give a protection film for flexible printed circuits that has excellent long-term reliability of electric insulation, flexibility, and low warpage from curing shrinkage, and particularly low tackiness.

18 Claims, No Drawings

THERMOSETTING RESIN COMPOSITION, THERMOSETTING RESIN COMPOSITION SOLUTION, FILM FORMING MATERIAL AND THEIR CURED PRODUCT

TECHNICAL FIELD

The present invention is related to a thermosetting resin composition comprising a carboxyl group-containing urethane resin and a curing agent. More particularly, it is related to a thermosetting resin composition, an overcoating agent and a surface protection film which are suitable for application to the overcoating of a flexible circuit board having strong adhesion strength in spite of lacking surface tackiness, flexibility, low warping, and excellent long-term reliability of electric insulation.

BACKGROUND ART

Surface protective films of flexible printed circuits are for example adhesive-bonded polyimide films, called coverlay films, that are punched out with a die conforming to the pattern, and are screen-printed films of UV or heat curable overcoating agents having flexibility, with the latter being more advantageous particularly in workability. Known such curable overcoating resins include resin compositions based on epoxy resins, acrylic resins or mixtures thereof. These compositions are often based on resins modified by introduction of butadiene, siloxane, polycarbonate diol or long chain aliphatic structures, whereby the flexibility is improved and the warpage due to cure shrinkage or heat shrinkage is prevented while minimizing the reduction of heat resistance, chemical resistance and electrical insulating properties inherent to the surface protective films.

With recent weight reduction and miniaturization of electronic equipment, flexible substrates are reduced in weight and thickness and are therefore more significantly susceptible to the flexibility and cure shrinkage of the overcoating resin compositions. Consequently, the curable overcoating resins do not satisfy performance requirements in terms of flexibility and warpage due to cure shrinkage.

JP-A-2004-137370 (Patent Document 1) discloses a polyamideimide resin produced through reaction of a polycarbonate diol from a diol having 6 or less carbon atoms, with a diisocyanate compound to prepare a polyurethane having two isocyanate groups at both ends, and reaction of the diisocyanate-terminated polyurethane with trimellitic acid. Cured products of the resin have unsatisfactory long-term reliability in electrical characteristics.

Furthermore, when the tackiness of a surface protection film after thermal curing of a resin composition is large, for example, the surface protection film adheres to a tape substrate in winding a reel off in the TAB (Tape Automated Bonding) application, or adheres to a clamper of the film in the case of ILB (Inner Lead Bonding) of LCD driver. Particularly, in the case of a thermosetting resin which has good adhesion to a substrate, the tackiness is liable to remain after curing. On the other hand, if a resin composition which has poor adhesion to a substrate or metal is used, the surface protection film is liable to peel off from a substrate, or long-term reliability of electric insulation of the surface protection film is lowered.

Patent Document 1 JP-A-2004-137370

DISCLOSURE OF THE INVENTION

An object of the present invention is to provide a thermosetting resin composition, a thermosetting resin composition solution, and a film forming material (overcoating agent) capable of giving a protection film for flexible printed circuits that has excellent long-term reliability of electric insulation, flexibility, low warpage from curing shrinkage, and particularly low tackiness.

Inventors of the present invention conducted extensive research to solve the above-mentioned problems, and found that a cured film of thermosetting resin composition comprising (A) a carboxyl group-containing urethane resin produced by reacting
  (a) a polyisocyanate compound,
  (b) polyol compounds being one or more kinds of polyol compound(s) selected from Group (I) and one or more kinds of polyol compound(s) selected from Group (II);
    Group (I): polycarbonate polyol, polyether polyol, polyester polyol, and polylactone polyol,
    Group (II): polybutadiene polyol, polysilicone having hydroxyl groups at both ends, polyol having 18 to 72 carbon atoms and oxygen atoms present only in hydroxyl groups, and
  (c) a carboxyl group-containing dihydroxy compound as raw materials; and
(B) a curing agent,
has low tackiness, good adhesion to a substrate, and excellent long-term reliability of electric insulation; and completed the present invention.

That is, the present invention relates to the following [1] to [23].

[1] A thermosetting resin composition comprising
(A) a carboxyl group-containing urethane resin prepared by using
  (a) a polyisocyanate compound,
  (b) polyol compounds and
  (c) a carboxyl group-containing dihydroxy compound as raw materials,
(B) a curing agent,
wherein the polyol compounds (b) are one or more kinds of polyol compound(s) selected from Group (I) and one or more kinds of polyol compound(s) selected from Group (II);
Group (I): polycarbonate polyol, polyether polyol, polyester polyol, and polylactone polyol,
Group (II): polybutadiene polyol, polysilicone having hydroxyl groups at both ends, polyol having 18 to 72 carbon atoms and oxygen atoms present only in hydroxyl groups.

[2] The thermosetting resin composition according to [1], wherein the carboxyl group-containing urethane resin (A) is prepared by further using (d) a monohydroxy compound as a raw material.

[3] The thermosetting resin composition according to [1] or [2], wherein the carboxyl group-containing urethane resin (A) is prepared by further using (e) a monoisocyanate compound as a raw material.

[4] A thermosetting resin composition according to any one of [1] to [3], wherein the polyol compounds (b) are selected from the polyol compounds of Group (I) and Group (II) at a weight ratio (Group (I)/Group (II) of 1/50 to 50/1.

[5] The thermosetting resin composition according to any one of [1] to [4], wherein the carboxyl group-containing urethane resin (A) is a mixture of a urethane resin prepared by using the polyol compounds of Group (I) as a raw material and a urethane resin prepared by using the polyol compounds of Group (II) as a raw material.

[6] The thermosetting resin composition according to any one of [1] to [4], wherein the carboxyl group-containing urethane resin (A) is a block urethane resin obtained by the reaction of one urethane resin having terminal isocyanate groups prepared by using polyol compound of either Group (I) or Group (II) as a raw material and another urethane resin having terminal hydroxyl groups prepared by using the other polyol compound with each other.

[7] The thermosetting resin composition according to any one of [1] to [4], wherein the carboxyl group-containing urethane resin (A) is obtained by starting reaction using polyol compound of either Group (I) or Group (II) and, after a conversion of the hydroxyl group of the polyol compound becomes 50% or more, further reacting the other polyol compound.

[8] The thermosetting resin composition according to any one of [1] to [4], wherein the carboxyl group-containing urethane resin (A) is obtained by starting reaction using a mixture of the polyol compound of Group (I) and Group (II).

[9] The thermosetting resin composition according to any one of [1] to [8]; wherein the polyisocyanate compound (a) is at least one compound selected from the group consisting of 1,4-cyclohexane diisocyanate, isophorone diisocyanate, methylenebis(4-cyclohexyl-isocyanate), hydrogenated 1,3-xylylene diisocyanate, and hydrogenated 1,4-xylylene diisocyanate.

[10] The thermosetting resin composition according to any one of [1] to [9], wherein the carboxyl group-containing dihydroxy compound (c) is 2,2-dimethylolpropionic acid and/or 2,2-dimethylolbutanoic acid.

[11] The thermosetting resin composition according to any one of [2] to [10], wherein the monohydroxy compound (d) is at least one compound selected from the group consisting of methanol, ethanol, n-propanol, isopropanol, n-butanol, isobutanol, sec-butanol, and tert-butanol.

[12] The thermosetting resin composition according to any one of [1] to [11], wherein the carboxyl group-containing urethane resin (A) has a number-average molecular weight in the range of 1,000 to 100,000, and an acid value in the range of 5 to 120 mg KOH/g.

[13] The thermosetting resin composition according to any one of [1] to [12], wherein the carboxyl group-containing urethane resin (A) has a number-average molecular weight in the range of 3,000 to 50,000, and an acid value in the range of 10 to 70 mg KOH/g.

[14] The thermosetting resin composition according to any one of [1] to [13], wherein the curing agent (B) is an epoxy compound having two or more epoxy groups per molecule.

[15] The thermosetting resin composition according to any one of [1] to [14], wherein the curing agent (B) is a bisphenol A epoxy resin, a bisphenol F epoxy resin or a their hydrogenated epoxy resin.

[16] The thermosetting resin composition according to any one of [1] to [14], wherein the curing agent (B) is an alicyclic epoxy compound.

[17] The thermosetting resin composition according to any one of [1] to [16], wherein the carboxyl group-containing urethane resin (A) is produced in the presence of solvent and has a micro-phase separation structure after the solvent evaporation and curing.

[18] A thermosetting resin composition solution comprising the thermosetting resin composition according to any one of [1] to [17] and a solvent (c) having a boiling point of 110° C. or higher and having no basic functional group.

[19] The thermosetting resin composition solution according to [18], wherein the solvent (c) is selected from the group consisting of toluene, xylene, ethyl benzene, nitrobenzene, isophorone, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, n-butyl acetate, isoamyl acetate, ethyl lactate, cyclohexanone, N,N-dimethylformamide, N,N-dimethylacetamide, N-methylpyrrolidone, γ-butyrolactone and dimethylsulfoxide.

[20] The thermosetting resin composition solution of [18] or [19], wherein the carboxyl group-containing urethane resin (A) is contained at a solid concentration of 30 to 80% by mass.

[21] A film forming material comprising the thermosetting resin composition according to any one of [1] to [17] or the thermosetting resin composition solution according to any one of [18] to [20], and an inorganic and/or organic fine particle (D).

[22] A film forming material comprising the thermosetting resin composition according to any one of [1] to [17] or the thermosetting resin composition solution according to any one of [18] to [20], and an anti-foaming agent (E).

[23] A cured product formed from the thermosetting resin composition according to any one of [1] to [17], the thermosetting resin composition solution according to any one of [18] to [20], or a film forming material according to [21] or [22].

The thermosetting resin composition, the thermosetting resin composition solution, and the film forming material (overcoating agent) of the present invention can give a protection film for flexible circuits that has excellent long-term reliability of electric insulation, flexibility, low warpage from curing shrinkage, and particularly low tackiness.

BEST MODE FOR CARRYING OUT THE INVENTION

Details of the thermosetting-resin composition, the thermosetting resin composition solution and the film forming material of the present invention are described below.

Thermosetting Resin Composition

The thermosetting resin composition of the present invention comprises; a carboxyl group-containing urethane resin (A) (hereinafter, also referred to as "carboxyl group-containing urethane (A)" or "carboxyl group-containing polyurethane (A)") and a curing agent (B).

(A) Carboxyl Group-Containing Urethane Resin:

A carboxyl group-containing urethane resin (A) of the present invention is produced by reacting
(a) a polyisocyanate compound,
(b) polyol compounds,
(c) a carboxyl group-containing dihydroxy compound,
(d) an optional monohydroxy compound, and
(e) an optional monoisocyanate compound with each other.

The polyol compounds (b) are one or more kinds of polyol compound(s) selected from Group (I) and one or more kinds of polyol compound(s) selected from Group (II);

Group (I): polycarbonate polyol, polyether polyol, polyester polyol, and polylactone polyol, Group (II) polybutadiene polyol, polysilicone having hydroxyl groups at both ends, and polyol compound having 18 to 72 carbon atoms and oxygen atoms present only in hydroxyl groups.

(a) Polyisocyanate Compound

Specifically, examples of the polyisocyanate compound (a) used in the present invention include 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethylether diisocyanate, diphenylmethane-4,4'-diisocyanate, (o-, m- or p-)xylene diisocyanate, methylenebis(4-cyclohexylisocyanate), cyclohexane-1,3-dimethylene diisocyanate, cyclohexane-1,4-dimethylene, diisocyanate, 1,5-naphthalene diisocyanate, p-phenylene diisocyanate, 3,3'-methylene ditolylene-4,4'-diisocyanate, 4,4'-diphenylether diisocyanate, tetrachlorophenylene diisocyanate, norbornane diisocyanate, and hydrogenated (1,3- or 1,4-)xylylene diisocyanate. The diisocyanates may be used singly or in combination of two or more kinds.

As the polyisocyanate compound (a), generally, a diisocyanate compound having two isocyanate groups per molecule is used. However, unless the carboxyl group-containing urethane resin (A) used in the present invention is gelated, a polyisocyanate compound that has 3 or more isocyanate groups per molecule such as triphenylmethane triisocyanate can be added in a small amount.

When an alicyclic compound that has 6 to 30 carbon atoms except for carbon atoms in isocyanate group (NCO group) is used as the polyisocyanate compound (a), the resulting cured product of the thermosetting resin composition of the present invention is especially excellent in long-term reliability of electric insulation at high temperature and high humidity.

Preferably the alicyclic compound is contained in the polyisocyanate compound (a) by 10 mol % or more to the total amount (100 mol %) of the polyisocyanate compound (a), more preferably, 20 mol % or more, further more preferably, 30 mol % or more.

Examples of these alicyclic compounds include 1,4-cyclohexane diisocyanate, isophorone diisocyanate, methylenebis (4-cyclohexylisocyanate), hydrogenated 1,3-xylylene diisocyanate, and hydrogenated 1,4-xylylene diisocyanate.

(b) Polyol Compound:

The polyol compound (b) used in the present invention has a number-average molecular weight, which is a value in terms of determined by GPC under the condition as described below, of in the range of 250 to 50,000, wherein the polyol compound (b) does not include a carboxyl group-containing dihydroxy compound (c) described below.

The polyol compound (b) used in the present invention can be classified into the following two groups:

Group (I): polycarbonate polyol, polyether polyol, polyester polyol, and polylactone polyol, Group (II): polybutadiene polyol, polysilicone having hydroxyl groups at both ends, and polyol compound having 18 to 72 carbon atoms and oxygen atoms present only in hydroxyl groups.

<Polyol of Group (I)>

The polycarbonate polyol can be obtained by the reaction of a diol having carbon atoms of 4 to 18 as a raw material with carbonic ester or phosgene. A chemical structure of the polycarbonate polyol can, for example, be represented by following structural formula (1):

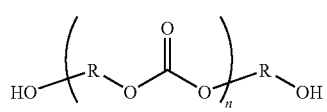

(1)

wherein R is a group given by removing hydroxyl groups from the corresponding diol (HO—R—OH), and n is a positive integer, preferably in the range of 2 to 50.

Specifically, the polycarbonate polyol represented by the structural formula (1) can be obtained by using 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethyleneglycol, 1,2-tetradecanediol or the like as the raw material.

The polycarbonate polyol may be a polycarbonate polyol having several different alkylene groups in the skeleton (a copolymer polycarbonate polyol), and the use of the copolymer polycarbonate polyol is often advantageous from the viewpoint of preventing crystallization of the carboxyl group-containing polyurethane (A). In addition, taking into consideration the solubility in the solvent, it is preferable to use concomitantly polycarbonate polyol having a branched structure and hydroxyl group(s) on its terminal group(s).

The polyether polyol is obtained by dehydration condensation of diols having 2 to 12 carbon atoms, or by ring-opening polymerization of oxiranes, oxetanes or tetrahydrofuran compounds having 2 to 12 carbon atoms. Its structure can be represented, for example, by following structural formula (2):

(2)

wherein R is a group given by removing hydroxyl groups from the corresponding diol (HO—R—OH), and n is a positive integer, preferably in the range of 4 to 50. Examples of such a polyether polyol represented by structural formula (2) include polyethylene glycol, polypropylene glycol, poly-1,2-butylene glycol, polytetramethylene glycol, and poly-3-methyltetramethylene glycol. A copolymer thereof may be used so as to improve the compatibility of the polyether polyol and hydrophobicity of polyether polyol.

The polyester polyol is obtained by dehydration condensation of dicarboxylic acid and diol or by ester exchange reaction of diol and lower alcohol ester of dicarboxylic acid with each other. Its structure can be represented, for example, by following structural formula (3):

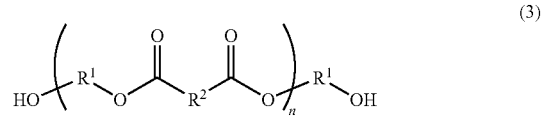

(3)

wherein $R^1$ is a group given by removing hydroxyl groups from the corresponding diol (HO—$R^1$—OH), $R^2$ is a group given by removing two carboxyl groups from the corresponding dicarboxylic acid (HOCO—$R^2$—COOH), and n is a positive integer, preferably in the range of 2 to 50.

Specifically, examples of the diol (HO—$R^1$—OH) include ethylene glycol, 1,2-propanediol, 1,3-propanediol, 1,2-butanediol, 1,3-butanediol, 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethylene glycol or 1,2-tetradecanediol, 2,4-diethyl-1,5-pentanediol, butylethylpropanediol, 1,3-cyclohexanedimethanol, 3-xylylene glycol, 1,4-xylylene glycol, diethylene glycol, triethylene glycol, and dipropylene glycol.

Specifically, examples of the dicarboxylic acid (HOCO—$R^2$—COOH) include succinic acid, glutaric acid, adipic acid, azelaic acid, sebacic acid, decanedicarboxylic acid, brassylic acid, 1,4-cyclohexanedicarboxylic acid, hexahydrophthalic acid, methyltetrahydrophthalic acid, endo-methylenetetrahydrophthalic acid, methylendomethylenetetrahydrophthalic acid, chlorendic acid, fumaric acid, maleic acid, itaconic acid, citraconic acid, phthalic acid, isophthalic acid, terephthalic acid, 1,4-naphthalenedicarboxylic acid, and 2,6-naphthalenedicarboxylic acid.

The polylactone polyol is obtained by ring-opening polymerization of lactone and diol, or by condensation of diol and hydroxyl alkanoic acid. Its structure may be represented, for example, by following structural formula (4):

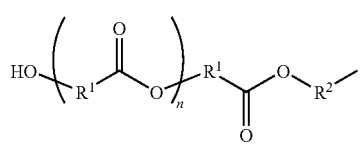

(4)

wherein $R^1$ is a group given by removing a hydroxyl group and a carboxyl group from the corresponding hydroxy alkanoic acid (HO—$R^1$—COOH), $R^2$ is a group given by removing hydroxyl groups from the corresponding diol (HO—$R^2$—OH), and n is a positive integer, preferably in the range of 2 to 50.

Specifically, examples of the hydroxyl alkanoic acid (HO—$R^1$—COOH) include 3-hydroxybutanoic acid, 4-hydroxypentanoic acid, and 5-hydroxyhexanoic acid ($\in$-caprolactone).

Specifically, examples of the diol (HO—$R^2$—OH) include the same diols as described above.

<Polyol of Group (II)>

The polybutadiene polyol is, for example, obtained by anionic polymerization of butadiene or isoprene, followed by introducing hydroxyl groups into both ends, and by hydrogenation of the double bonds of the resulting polymer.

Examples of polybutadiene polyol include hydroxylated polybutadiene having 1,4-repeating units as a majority of the main chain (for example, Poly bd R-45HT, and Poly bd R-15HT, manufactured by Idemitsu Kosan Co., Ltd.), hydroxylated and hydrogenated polybutadiene (for example, Polytail H, and Polytail HA, manufactured by Mitsubishi Chemical Corp.), hydroxylated polybutadiene having 1,2-repeating units as a majority of the main chain (for example, G-1000, G-2000, and G-3000, manufactured by Nippon Soda Co., Ltd.), hydroxylated and hydrogenated polybutadiene (for example, GI-1000, GI-2000, and GI-3000 obtained from Nippon Soda Co., Ltd.), hydroxylated polyisoprene (for example, Poly IP, manufactured by Idemitsu Kosan Co., Ltd.), and hydroxylated and hydrogenated polyisoprene (for example, Epol, manufactured by Idemitsu Kosan Co., Ltd.).

The polysilicone having hydroxyl groups at both ends is represented, for example, the following structure formula (5)

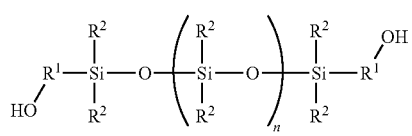

(5)

wherein $R^1$ is independently an aliphatic hydrocarbon or an aromatic hydrocarbon having 2 to 50 carbon atoms and it may have ether group, and plural $R^2$ s are independently aliphatic or aromatic hydrocarbons having 1 to 12 carbon atoms.

A commercially available product of the hydroxylated polysilicone at both ends is, for example, "X-22-160AS, KF6001, KF6002, and KF-6003" manufactured by Shin-Etsu Chemical Co., Ltd.

The polyol having 18 to 72 carbon atoms and oxygen atoms present only in hydroxyl groups has no oxygen atom except for oxygen atoms of hydroxyl groups.

Examples of the polyol having 18 to 72 carbon atoms having oxygen atoms present only in hydroxyl groups include a diol compound which has a skeleton of hydrogenated dimer acid, and as examples of commercially available product thereof include "Sovermol 908" obtained from Cognis Japan Ltd.

Regarding the blending method of the polyol compounds of Group (I) and Group (II), examples of the method for synthesis of the carboxyl group-containing urethane (A) preferably include the following methods 1 to 4.

<Method 1>

A method to synthesize the carboxyl group-containing urethane (A) by starting reaction using a mixture of the polyol compounds of Group (I) and Group (II). That is, Method 1 is a method to synthesize the carboxyl group-containing urethane by using a mixture of the polyol compounds of Group (I) and Group (II) as raw materials from the beginning of the reaction for synthesis of the carboxyl group-containing urethane.

<Method 2>

A method to synthesize the carboxyl group-containing urethane (A) by starting synthetic reaction of the carboxyl group-containing urethane (A) using polyol compound of either Group (I) or Group (II) and, after a conversion of the hydroxyl group of the polyol compound becomes 50% or more, further reacting the other polyol compound.

After a conversion of the hydroxyl group of the first used polyol becomes 50% or more, the first used polyol may be further added for reaction.

It can be confirmed by the following method that a conversion of the hydroxyl group becomes 50% or more.

That is, an isocyanate group of an isocyanate compound which reacts with the hydroxyl group is quantified by butyl amine method, so that the conversion of the hydroxyl group is calculated from a degree of the reaction of the isocyanate group. Actually, such a quantitative analysis can be avoided, as a conversion of the hydroxyl group is considered to be almost 100% when the reaction is taken place in the presence of an excess amount of the isocyanate group until the molecular weight does not change anymore.

<Method 3>

A method to synthesize the carboxyl group-containing urethane (A) by the reaction of one urethane resin having terminal isocyanate groups prepared by using polyol compound of either Group (I) or Group (II) and another urethane resin having terminal hydroxyl groups prepared by using the other polyol compound with each other.

That is, in Method 3, one polyurethane is synthesized by using polyol compound of either Group (I) or Group (II) at such a molar ratio that the diol groups are introduced at the terminals of the polymer, another polyurethane is synthesized by using the other polyol compound at such a molar ratio that isocyanate groups are introduced at the terminals of the polymer, and the two polyurethane precursors thus obtained are mixed and reacted to complete the urethane synthesis.

Accordingly, a block copolymer urethane resin is obtained in which the both urethane blocks are introduced.

As a modified version of Method 3, there can be mentioned a method to complete urethane synthesis in which one polyurethane having terminal hydroxyl groups is synthesized by using a polyol compound of Group (I), and another polyurethane having terminal hydroxyl groups is synthesized by using a polyol compound of Group (II), and then a mixture of these two polyurethane precursors and a polyisocyanate compound are reacted with each other, and an alternative method to complete urethane synthesis in which two kinds of polyurethanes having terminal isocyanate groups are synthesized and a mixture of these two polyurethane precursors and a polyol are reacted with each other.

<Method 4>

A method to prepare the carboxyl group-containing polyurethane (A) by blending a urethane resin prepared by using a polyol compound of Group (I) as a raw material, referred to as "Urethane I", and another urethane resin prepared by using a polyol compound of Group (II), referred to as "Urethane II".

In the Method 4, both urethanes (I) and (II) are blended in the film forming material described below without reaction between them before the blending. The two urethanes, (I) and (II), may react each other after the blending.

A cured product of the urethane resin (I) has better adhesion to a substrate (Cu wire board or polyimide film) and higher water absorption, while a cured product of the urethane resin (II) has poor adhesion to the substrate, but is flexible and lower in water absorption.

If a product of either urethane resin (I) or urethane resin (II) is singly used, disadvantage of each resin became more prominent. For example, in the case of the cured product of urethane resin (I), there were such problems that anti-insulating characteristics was poor, or insulating resistance was lowered, even if dielectric breakdown did not occur. In addition, the film flexibility was also problematic. On the other hand, the cured product of urethane resin (II) had an unsatisfactory level of performance as a protection film for circuits due to an insufficient adhesion to the substrate, although insulation durability and flexibility were fundamentally in a satisfactory level as an overcoating resin.

In the present invention, these two resins, the urethane resins (I) and (II), were combined so that the resulting cured product had such a performance as to compensate each problem. Such a effect by the combining becomes the most prominent when the cured product of the carboxyl group-containing urethane resin (A) has a micro-phase separation structure. The cured product has, in addition, specific stress relaxation characteristics and excellent adhesion to the substrate with keeping good heat resistance, resulting from the micro-phase separation structure.

In order to highly generate the effect by the combining, more laborious steps are required to synthesize the carboxyl group-containing urethane resin (A). The resulting structure of the cured product of the carboxyl group-containing urethane resin (A) tends to be homogeneous by applying Method 1, while it tends to cause a macroscopic phase separation by applying Method 4. In addition, it is easier to obtain the microscopic phase separation structure of the cured product by Method 2 and Method 3 in this order.

It is also possible to control the phase structure to some extent by changing drying conditions of solvent or curing conditions. In the case of Method 4, the phase structure can be changed by blending method of the urethane resins I and II. A particularly effective means is to disperse each urethane resin by using a powerful blending machine such as a homogenizer. Even if the macro-phase separation or homogeneous structure was formed, a certain level of the effect can be expected. Therefore, it is recommended to select the best way from the above-described methods for the best balance of effect vs. time.

In the case of the methods 2 to 4, for the phase-separation structure control, it is also effective to partially use the polyol compound of the other group in the synthesis of the urethane resin using the polyol compound of one group. It may also be effective to use a diol compound having a molecular weight of less than 300 in such a range that the characteristics of the resulting cured product are not damaged.

Specifically, examples of such a low molecular weight diol compound include ethylene glycol, 1,2-propanediol, 1,3-propanediol, 1,2-butanediol, 1,3-butanediol, 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 1,10-decamethylene glycol, 1,2-tetradecanediol, 2,4-diethyl-1,5-pentanediol, butylethylpropanediol, 1,3-cyclohexanedimethanol, 1,3-xylylene glycol, 1,4-xylylene glycol, diethylene glycol, triethylene glycol, and dipropylene glycol.

It is effective in the preparation of the carboxyl group-containing urethane resin (A) to increase the blending ratio of the polyol compound of Group (I) when the adhesion of the carboxyl group-containing urethane resin (A) is highlighted, or to increase the blending ratio of the polyol compound of Group (II) when the flexibility of the carboxyl group-containing urethane resin (A) is highlighted. Hence, although it is difficult to say which polyol should be in excess, the blending ratio of Group (I) to Group (II) (Group (I)/Group (II)) is preferably in the range of 1/50 to 50/1, more preferably in the range of 1/25 to 25/1. The effect by the combining tends to become poor if the blending ratio is out of these ranges.

(c) Carboxyl Group-Containing Dihydroxyl Compound:

Specifically, examples of the carboxyl group-containing dihydroxy compound (c) used in the present invention include 2,2-dimethylolpropionic acid, 2,2-dimethylolbutanoic acid, N,N-bishydroxyethylglycine, and N,N-bishydroxyethylalanine. Among them, 2,2-dimethylolpropionic acid and 2,2-dimethylolbutanoic acid are especially preferred in terms of solubility in a solvent. The carboxyl group-containing dihydroxy compounds (C) may be used singly or in combination of two or more kinds.

(d) Monohydroxy Compound, (e) Monoisocyanate Compound:

The carboxyl group-containing urethane resin (A) used in the present invention can be synthesized from only the three components (a), (b) and (c) For the purpose of giving radical or cationic polymerizability to the urethane, or of eliminating the influence of the isocyanate residue or the hydroxyl group residue at ends of the polyurethane, a monohydroxy compound (d) and/or a monoisocyanate compound (e) can be added in the reaction.

Examples of the monohydroxy compounds (d) used for giving radical or cationic polymerizability to the polyurethane used in the present invention include compounds having radically polymerizable double bonds, such as 2-hydroxyethyl (meth)acrylate, hydroxypropyl (meth)acrylate, hydroxybutyl (meth)acrylate, cyclohexanedimethanol mono (meth)acrylate, caprolactone or oxyalkylene adducts of the above-described (meth)acrylates, glycerine di(meth)acrylate, trimethylol di(meth)acrylate, pentaerythritol tri(meth)acrylate, dipentaerythritol penta(meth)acrylate, ditrimethylol propanetri(meth)acrylate, allyl alcohol, and allyloxy ethanol; and compounds having carboxylic acids, such as glycolic acid and hydroxypivalic acid.

The monohydroxy compounds may be used singly or in combination of two or more kinds. Among them, 2-hydroxyethyl (meth)acrylate, hydroxypropyl (meth)acrylate, hydroxybutyl (meth)acrylate, allyl alcohol, glycolic acid, and hydroxypivalic acid are preferred, and 2-hydroxyethyl (meth) acrylate is more preferred.

Examples of the monohydroxy compounds (d) used for eliminating the influence of the isocyanate residue at ends of the polyurethane used in the present invention include the above monohydroxy compounds, methanol, ethanol, n-propanol, isopropanol, n-butanol, isobutanol, sec-butanol, tert-butanol, amyl alcohol, hexyl alcohol, and octyl alcohol.

Examples of the monoisocyanate compounds (e) include compounds having radical double bonds such as (meth)acryloyl oxyethyl isocyanate; mono-adducts of a diisocyanate compound with 2-hydroxyethyl (meth)acrylate, hydroxypropyl (meth)acrylate, hydroxybutyl (meth)acrylate, cyclohexanedimethanol mono(meth)acrylate, adducts of caprolactone or a alkylene oxide with the above-described (meth)acrylates, glycerine di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol or allyloxy ethanol.

Examples of the monoisocyanate hydroxy compounds used for eliminating the influence of the terminal hydroxyl residue include phenyl isocyanate, hexyl isocyanate, and dodecyl isocyanate.

<Carboxyl Group-Containing Polyurethane (A)>

The carboxyl group-containing polyurethane (A) used in the present invention preferably has a number-average molecular weight of 1,000 to 100,000, and more preferably 3,000 to 50,000, wherein the molecular weight is a value in terms of polystyrene determined by gel permeation chromatography (GPC). The elongation, flexibility and strength of the cured product may be too poor when the molecular weight is less than 1,000. On the other hand, when the molecular weight more than 100,000, solubility of the polyurethane to the solvent may be poor and a viscosity of the solution, even though dissolved, may be too high, so that the application may be limited.

The measurement condition of GPC is as follows in this description unless described otherwise:

Chromatograph: HPLC unit HSS-2000 manufactured by JASCO Corporation

Column: Shodex Column LF-804

Eluent: Tetrahydrofuran

Flow Rate: 1.0 mL/min

Detector: RI-2031 Plus manufactured by JASCO Corporation

Temperature: 40.0° C.

Sample size: 100 µl placed in a sample loop

Sample Concentration: approximately 0.1 wt %

The carboxyl group-containing polyurethane (A) preferably has an acid value of 5 to 120 mg KOH/g, more preferably 10 to 70 mg KOH/g. When the acid value is less than 5 mg KOH/g, the reactivity with other curable resins such as an epoxy resins may be lowered and the heat resistance may be often deteriorated. When the acid value exceeds 120 mg KOH/g, the resulting cured film may be too rigid and brittle.

In this description, the acid value was measured according to the following method:

Approximately 0.2 g of a sample is weighed in a 100 ml conical flask using a precision balance, and the sample is dissolved by adding 10 ml of an ethanol/toluene mixed solvent (½ by weight). One to three droplets of phenolphthalein/ethanol solution as an indicator are added to the flask, and the mixture is stirred sufficiently to uniformity. The mixture is titrated with a 0.1N potassium hydroxide/ethanol solution, and the end point of neutralization is obtained when the indicator is slightly red for 30 seconds. The results are put to the following equation to calculate the acid value of the resin.

$$\text{Acid value (mgKOH/g)} = [B \times f \times 5.611]/S$$

wherein:

B: consumption (ml) of 0.05N potassium hydroxide/ethanol solution f: factor of 0.05N potassium hydroxide/ethanol solution S: amount of sample (g)

When the different types of polyol compounds of Group (I) and (II) are separately reacted as in the case of Method 3 or 4, acid values or molecular weights of both urethane resin precursors obtained in the process of the carboxyl group-containing polyurethane (A) may not be the same but can be varied in the range as described above.

In the case of producing of the block polymer type carboxyl group-containing polyurethane (A) according to Method 3, an acid value of the carboxyl group-containing polyurethane (A) should be in the same range as described above, but an acid value of one of the two urethane resin precursors, the isocyanated terminal urethane and hydroxylated terminal urethane, may be less than 5 mg KOH/g or more than 120 mg KOH/g.

The carboxyl group-containing polyurethane (A) used in the present invention may be synthesized by reacting the polyisocyanate compound (a), polyol compounds (b), dihydroxy compound (c), optional monohydroxy compound (d) and optional monoisocyanate compound (e) in the absence or presence of a known urethanization catalyst such as dibutyltin dilaurate, in an appropriate organic solvent. The reaction without the catalyst results in higher properties when the cured film is actually used.

The organic solvent has low reactivity with isocyanates. Desirable solvents are free of basic functional group such as amines and have a boiling point of not less than 110° C., preferably not less than 200° C. Examples of such solvents include toluene, xylene, ethyl benzene, nitrobenzene, cyclohexane, isophorone, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethylsulfoxide, chloroform, and methylene chloride.

Of these, propylene glycol methyl ether acetate, propylene glycol ethyl ether acetate, dipropylene glycol methyl ether acetate, diethylene glycol ethyl ether acetate, γ-butyrolactone, and the like are preferable in view of the facts that the organic solvents in which the carboxyl group-containing polyurethane (A) shows low solubility are not preferable and that the polyurethane has an application in electronic materials in which it is used as a material of inks.

The addition sequence of the materials is not particularly limited. Generally, the polyol compounds (b) and dihydroxy compound (c) are fed first and dissolved in the solvent, and the polyisocyanate compound (a) is added dropwise at 20 to 150° C., more preferably 60 to 120° C., and these are reacted together at 30 to 160° C., more preferably 50 to 130° C.

The molar ratio of the materials is controlled depending on an objective molecular weight and acid value of the polyurethane. When the monohydroxy compound (d) is introduced in the polyurethane, it is necessary that the polyisocyanate compound (a) be used in excess over the polyol compounds (b) and carboxyl group-containing dihydroxy compound (c) (so that the isocyanate groups are excess over the total hydroxyl groups) such that the polyurethane molecule is terminated with the isocyanate groups.

Specifically, the molar ratio of the polyisocyanate compound (a): (the polyol compounds (b)+ the carboxyl group-containing dihydroxy compound (c)) is in the range of 0.5 to 1.5:1, preferably, 0.8 to 1.2:1.

In addition, the molar ratio of the polyol compound (b) the carboxyl group-containing dihydroxy compound (c) is in the range of 1:0.1 to 30, preferably 1:0.3 to 10.

When the monohydroxy compound (d) is used, it is preferable that the number of moles of the polyisocyanate compound (a) be excess over that of the polyol compounds (b) plus the carboxyl group-containing dihydroxy compound (c), and the molar amount of the monohydroxy compound (d) be 0.5 to 1.5 times, preferably 0.8 to 1.2 times the excessive moles of the NCO groups.

When the polyisocyanate compound (e) is used, it is preferable that the number of moles of the polyol compounds (b) plus the carboxyl group-containing dihydroxy compound (c) be excess over that of the polyisocyanate compound (a), and the molar amount of the monoisocyanate compound (e) be 0.5 to 1.5 times, preferably 0.8 to 1.2 times the excessive moles of the hydroxyl groups.

To introduce the monohydroxy compound (d) in the polyurethane, the monohydroxy compound (d) is added dropwise to the solution of the polyurethane at 20 to 150° C., more preferably 70 to 120° C. when the reaction of the polyol compounds (b) and carboxyl group-containing dihydroxy compound (c) with the polyisocyanate compound (a) has substantially terminated, whereby the isocyanate groups remaining at both ends of the polyurethane are reacted with the monohydroxy compound (d); thereafter the temperature is maintained constant to allow the reaction to complete.

To introduce the monoisocyanate compound (e) in the polyurethane, the monoisocyanate compound (e) is added dropwise to the solution of the polyurethane at 20 to 150° C., more preferably 50 to 120° C. when the reaction of the polyol compounds (b) and carboxyl group-containing dihydroxy compound (c) with the polyisocyanate compound (a) has substantially terminated, whereby the hydroxyl groups remaining at both ends of the polyurethane are reacted with the monoisocyanate compound (e); thereafter the temperature is maintained constant to allow the reaction to complete.

(B) Curing Agent:

The curing agent (B) cures the carboxyl group-containing polyurethane (A), and is preferably an epoxy resin.

Examples of such an epoxy resin include bisphenol A epoxy resin, hydrogenated bisphenol A epoxy resin, brominated bisphenol A epoxy resin, bisphenol F epoxy resin, novolac epoxy resin, phenol-based novolac epoxy resin, cresol-based novolac epoxy resin, alicyclic epoxy resin, N-glycidyl epoxy resin, bisphenol A-containing novolac-based epoxy resin, chelate epoxy resin, glyoxal epoxy resin, amino group-containing epoxy resin, rubber modified epoxy resin, dicyclopentadiene phenolic epoxy resin, silicone modified epoxy resin, ∈-caprolactone modified epoxy resin, and the like, which are epoxy compounds having two or more epoxy groups per molecule.

In order to give flame retardation, such an epoxy compound that has a halogen atom like chlorine and bromine, or a phosphorus atom and the like are introduced in the structure may be used. Furthermore, bisphenol S epoxy resin, diglycidylphthalate epoxy resin, heterocyclic epoxy resin, bixylenol epoxy resin, biphenol epoxy resin, tetraglycidylxylenoylethane resin and the like may also be used.

As the epoxy resin, it is preferable to use an epoxy compound that has two or more epoxy groups per molecule but such an epoxy compound that has only one epoxy group per molecule may be used concomitantly.

Thermosetting Resin Composition Solution

The thermosetting resin composition solution of the present invention comprises the thermosetting resin composition and a solvent (C).

(C) Solvent:

In the present invention, it is preferred to use a solvent (C). The thermosetting resin composition of the present invention is preferably in a state dissolved in a solvent (C), and more preferably in a state dissolved in the same solvent that is used for synthesis of the carboxyl group-containing polyurethane resin (A).

A reason for it is that if the thermosetting resin composition of the present invention is obtained in the absence of a solvent, it is difficult to homogeneously disperse the carboxyl group-containing polyurethane (A) in the composition.

Another reason is that if the solvent (C) is the same solvent that is used for synthesis of the carboxyl group-containing polyurethane (A), it is preferable because the step to re-dissolve the carboxyl group-containing polyurethane (A) is not necessary so that it is cost-effective.

So far as the carboxyl group-containing polyurethane (A) can be dissolved, any solvent can be used without limitation as the solvent (C). The solvent (C) has a boiling point of preferably 30° C. to 400° C., more preferably 110° C. to 300° C.

Furthermore, it is preferred for the solvent (C) to have a boiling point of not less than 110° C. and to have no basic functional group.

Examples of the solvent (C) include toluene, xylene, ethyl benzene, nitrobenzene, cyclohexane, isophorone, diethylene glycol dimethyl ether, ethylene glycol diethyl ether, carbitol acetate, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethylsulfoxide, chloroform, and methylene chloride.

When the solvent (C) is used, a concentration (solid content) of the carboxyl group-containing polyurethane (A) is preferably 10 to 90 wt %, and more preferably 30 to 80 wt %.

Film Forming Material

The film forming material of the present invention comprises the thermosetting resin composition or the thermosetting resin composition solution and an inorganic and/or organic fine particle (D) or an anti-foaming agent (E).

The inorganic and/or organic fine particle (D) may be conventional materials. Its amount is varied depending on the carboxyl group-containing polyurethane (A), and is in the range of 5 to 40 wt % to the total amount of the resin composition.

Examples of the organic fine particle (organic filler) include epoxy resin powder, melamine resin powder, urea resin powder, guanamine resin powder, polyester resin powder, and silicone powder. Examples of the inorganic fine particle (inorganic filler) include silica, alumina, titanium oxide, barium sulfate, talc, calcium carbonate, glass powder, and quartz powder.

The anti-foaming agent (E) may be a silicone anti-foaming agent or a non-silicone anti-foaming agent, and may be used especially in consideration of the bubble trapping or releasing property in screen printing. These anti-foaming agents may be used in combination of plural kinds. Its amount or ratio is not particular limited, and may be varied taking into account the bubble trapping and releasing property in screen printing. Preferable examples of the silicone anti-foaming agents include KS-602A, KS-66, KS-603, KS-608, and FA-600 (trade name, manufactured by Shin-Etsu Chemical Co., Ltd.) and BYK-A530 (trade name, manufactured by BYK Chemie, Japan). Preferable examples of the non-silicone anti-foaming include BYK-051, BYK-052, BYK-053, BYK-055, BYK-057, BYK-354, and BYK-355 (trade name, manufactured by BYK Chemie Japan KK). The amount or ratio of these agents is not particular limited.

The thermosetting resin composition, the thermosetting resin composition solution, or the film forming material of the present invention may further contain a curing accelerator.

Examples of the curing accelerator include known curing agents and curing accelerators, for example:

imidazole derivatives such as CUREZOL series 2MZ, 2E4MZ, C11Z, C17Z, 2PZ, 1B2MZ, 2MZ-CN, 2E4MZ-CN, C11Z-CN, 2PZ-CN, 2PHZ-CN, 2MZ-CNS, 2E4MZ-CNS, 2PZ-CNS, 2MZ-AZINE, 2E4MZ-AZINE, C11Z-AZINE, 2MA-OK, 2P4 MHZ, 2PHZ and 2P4BHZ manufactured by SHIKOKU CHEMICALS CORPORATION;

guanamines such as acetoguanamine and benzoguanamine;

polyamines such as diaminodiphenylmethane, m-phenylenediamine, m-xylenediamine, diaminodiphenylsulfone, dicyandiamide, urea, urea derivatives, melamine and polybasic hydrazide;

organic acid salts and/or epoxy adducts thereof;

amine complexes of boron trifluoride;

triazine derivatives such as ethyldiamino-S-triazine, 2,4-diamino-S-triazine and 2,4-diamino-6-xylyl-S-triazine;

amines such as trimethylamine, triethanolamine, N,N-dimethyloctylamine, N-benzyldimethylamine, pyridine, N-methylmorpholine, hexa(n-methyl)melamine, 2,4,6-tris (dimethylaminophenol), tetramethylguanidine and m-aminophenol;

polyphenols such as polyvinylphenol, polyvinylphenol bromide, phenol novolak and alkylphenol novolaks;

organic phosphines such as tributylphosphine, triphenylphosphine and tris-2-cyanoethylphosphine;

phosphonium salts such as tri-n-butyl(2,5-dihydroxyphenyl)phosphonium bromide and hexadecyltributylphosphonium chloride;

quaternary ammonium salts such as benzyltrimethylammonium chloride and phenyltributylammonium chloride;

anhydrides of the polybasic acids mentioned above;

photo-cationic polymerization catalysts such as diphenyl iodonium tetrafluoroborate, triphenyl sulfonium hexafluoroantimonate, 2,4,6-triphenyl thiopyrilium hexafluorophosphate, IRGACURE 261 manufactured by Ciba Specialty Chemicals Inc., and Optomer SP-170 manufactured by Asahi Denka Co., Ltd.;

styrene-maleic anhydride resin; and equimolar reaction products of phenyl isocyanate and dimethylamine, and equimolar reaction products of dimethylamine and organic polyisocyanates such as tolylene diisocyanate and isophorone diisocyanate.

The thermosetting resin composition, the thermosetting resin composition solution, or the film forming material of the present invention may further contain other conventional additives, for example, a fiber enforcing material such as a glass fiber, a carbon fiber, or boron nitride fiber; a colorant such as titanium oxide, zinc oxide, carbon black, iron black, organic pigments, or organic dyes; an antioxidant such as hindered phenol-based compounds, phosphorous compounds, or hindered amine-based compounds; a UV absorbent such as benzotriazoles, or benzophenones.

Furthermore, a viscosity modifier, a flame retardant, an anti-bacterial, an anti-mold agent, an anti-ageing agent, an anti-statistic agent, a plasticizer, a lubricant, a foaming agent, and the like may be added and mixed, depending on the use for application.

Each component can be dissolved or dispersed by using a mixing machine like disperser, kneader, roll mill with three rolls, beads mill, or homogenizer.

Curing Method of Thermosetting Resin Composition

The thermosetting resin composition of the present invention can be cured according to such a curing procedure that the carboxyl group-containing polyurethane (A) is blended and kneaded optionally with solvent (C), inorganic and/or organic fine particle (D), anti-foaming agent (E), a curing accelerator, and the like, the curing agent (B) is added to the blend to prepare a composition (hereinafter referred to as "film forming material" or "overcoating agent"), and then the composition is coated on a substrate by such a method as screen printing, followed by drying and heating. The surface protecting can be obtained on substrate by such a curing method as described above.

The cured product of the present invention obtainable from the thermosetting resin composition, the thermosetting resin composition solution or the film forming material of the present invention according to the above-mentioned method has excellent properties of tackiness at high temperature, adhesion to substrate, low warpage, flexibility, plating resistance, soldering heat resistance, and long-term reliability of electric insulation.

EXAMPLES

The present invention will be described by examples below, but it should be construed that the invention is in no way limited to such examples.

<Production of Carboxyl Group-Containing Polyurethane According to Above-Mentioned Method 1>

Synthetic Example 1-1

A reaction vessel equipped with a stirrer, a thermometer and a condenser was charged with 660.6 g of C-1015N (manufactured by KURARAY CO., LTD., polycarbonate diol, a molar ratio of the raw material diol; 1,9-nonanediol:2-methyl-1,8-octyldiol=15:85; Mw=964) as the polyol compound of Group I, 73.39 g of G-1000 (manufactured by Nippon Soda Co., Ltd., 1,2-polybutadiene having hydroxyl groups at both ends, Mw=1548) as the polyol compound of Group II 138.4 g of carboxyl group-containing dihydroxy compound 2,2-dimethylolbutanoic acid (manufactured by Nippon Kasei Chemical Co., Ltd.) and 1303 g of diethylene glycol ethylether acetate (manufactured by DAICEL CHEMICAL INDUSTRIES, LTD.) as solvent. The 2,2-dimethylolbutanoic acid was dissolved at 90° C.

The reaction liquid was cooled to 70° C., and 437.3 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, 100° C. for 1 hour, and 120° C. for 2 hours. When the substantial disappearance of the isocyanate was confirmed by IR spectroscopy, 5 g of isobutanol (manufactured by Wako Pure Chemical Industries, Ltd.) was added dropwise and reaction was performed at 120° C. for 1.5 hours.

The carboxyl group-containing polyurethane obtained had a number-average molecular weight of 13, 800 and an acid value of the solid of 40.2 mgKOH/g.

Synthetic Example 1-2 to 1-12

Other carboxyl group-containing polyurethanes were synthesized in the same manner as in Synthetic Example 1-1, except for the composition and blending ratio, as shown in Table 1. The properties of resulting polyurethanes are shown in Table 1.

<Synthesis of Carboxyl Group-Containing Polyurethane According to Above-Mentioned Method 2>

Synthetic Example 2-1

The 2,2-dimethylolbutanoic acid was dissolved at 90° C.

A reaction vessel equipped with a stirrer, a thermometer and a condenser was charged with 73.39 g of G-1000 (manufactured by Nippon Soda Co., Ltd., 1,2-polybutadiene having hydroxyl groups at both ends, Mw=1548) as the polyol compound of Group II 38.4 g of carboxyl group-containing dihydroxy compound 2,2-dimethylolbutanoic acid (manufactured by Nippon Kasei Chemical Co., Ltd.) and 1000 g of diethylene glycol ethylether acetate (manufactured by DAICEL CHEMICAL INDUSTRIES, LTD.) as solvent. The 2,2-dimethylolbutanoic acid was dissolved at 90° C.

The reaction liquid was cooled to 70° C., and 437.3 g of polyisocyanate DESMODUR W (manufactured by Sumika Bayer Urethane Co., Ltd.) was added dropwise with a dropping funnel over a period of 30 minutes. After the completion of the dropwise addition, reaction was performed at 80° C. for 1 hour, and 100° C. for 2 hours.

When the molecular weight of the product was confirmed to show almost no changes by GPC, the reaction temperature was lowered to 70° C., and then 100 g of 2,2-dimethylolbutanoic acid (manufactured by Nippon Kasei Chemical Co., Ltd.) was added with a solid funnel. Then, after 30 minutes, a solution of 660.6 g of C-1015 N (manufactured by KURARAY CO., LTD. polycarbonate diol, a molar ratio of the raw material diol compounds: 1,9-nonanediol:2-methyl-1,8-octanediol=15:85, Mw=964) as the polyol compound of Group I dissolved in 303 g of diethylene glycol ethylether acetate (manufactured by DAICEL CHEMICAL INDUSTRIES, LTD.) was added dropwise. Then, the temperature was raised, and reaction was performed at 100° C. for 1 hour, and 120° C. for 3 hours. When the substantial disappearance of the isocyanate was confirmed, 5 g of isobutanol (manufactured by Wako Pure Chemical Industries, Ltd.) was added dropwise and reaction was performed at 120° C. for 1.5 hours.

The carboxyl group-containing polyurethane obtained had a number-average molecular weight of 16,800 and an acid value of the solid of 38.4 mgKOH/g.

Synthetic Example 2-2

A reaction vessel equipped with a stirrer, a thermometer and a condenser was charged with 55.2 g of KF-6001 (manufactured by Shin-Etsu Chemical Co., Ltd., polysilicone having hydroxyl groups at both ends, Mw=1840) as the polyol compound of Group II, 51.1 g of carboxyl group-containing dihydroxy compound 2,2-dimethylolbutanoic acid (manufactured by Nippon Kasei Chemical Co., Ltd.), and 421.2 g of γ-butyrolactone (manufactured by Mitsubishi Chemical Corporation) as solvent. The 2,2-dimethylolbutanoic acid was dissolved at 100° C. The reaction liquid was cooled to 90° C., and 317.3 g of polyisocyanate DESMODULE-W (manufactured by Sumika Bayer Urethane Co., Ltd.) was added dropwise with a dropping funnel over a period of 5 minutes. After the completion of the dropwise addition, reaction was performed at 110° C. for 2 hours.

When the molecular weight of the product was confirmed to show almost no changes by GPC, the reaction temperature was lowered to 90° C. and then a solution of 51.1 g of 2,2-dimethylolbutanoic acid (manufactured by Nippon Kasei Chemical Co. Ltd.), and 472.8 g of C-1090, (manufactured by KURARAY CO., LTD. polycarbonate diol, a molar ratio of the raw material diol compounds: 1,6-hexanediol:3-methyl-1,5-pentanediol=10:90, Mw=992) as the polyol compound of Group I, dissolved in 544 g of γ-butyrolactone (manufactured by Mitsubishi Chemical Co., Ltd. was added dropwise with a dropping funnel. Then, the temperature was raised, and the reaction was performed at 110° C. for 4 hours. When the substantial disappearance of the isocyanate was confirmed, 5 g of isobutanol (manufactured by Wako Pure Chemical Industries, Ltd.) was added dropwise, and the reaction was further performed at 120° C. for 1.5 hours.

The carboxyl group-containing polyurethane obtained had a number-average molecular weight of 8,000 and an acid value of the solid of 39.8 mgKOH/g.

Synthetic Example 2-3

A reaction vessel equipped with a stirrer, a thermometer and a condenser was charged with 307.8 g of G-1000 (manufactured by Nippon Soda Co., Ltd. 1,2-polybutadiene having hydroxyl groups at both ends, Mw=1548) as the polyol compound of Group II, 51.9 g of carboxyl group-containing dihydroxy compound 2,2-dimethylolbutanoic acid (manufactured by Nippon Kasei Chemical Co., Ltd.), and 1089 g of diethylene glycol ethylether acetate (manufactured by DAICEL CHEMICAL INDUSTRIES, LTD.) as solvent. The 2,2-dimethylolbutanoic acid was dissolved at 100° C.

The reaction temperature was lowered to 90° C., and 335.7 g of polyisocyanate DESMODULE-W (manufactured by Sumika Bayer Urethane Co., Ltd.) was added dropwise with a dropping funnel over a period of 5 minutes. After the completion of dropping, the reaction was performed at 110° C. for 2 hours.

When the molecular weight of the product was confirmed to show almost no changes by GPC, the temperature was lowered to 90° C., and then 62.1 g of 2,2-dimethylolbutanoic acid (manufactured by Nippon Kasei Chemical Co., Ltd.) and 311.0 g of PTMG-1000 (manufactured by Mitsubishi Chemical Corporation, polyether polyol:polytetramethylene glycol, Mw=1014) as the polyol compound of Group I were added. Then, the temperature was raised, and the reaction was performed at 110° C. for 4 hours. When the substantial disappearance of the isocyanate was confirmed, 5 g of isobutanol (a product of Wako Pure Chemical Industries, Ltd.) was added dropwise and then, the reaction was further performed at 120° C. for 1.5 hours.

The carboxyl group-containing polyurethane obtained had a number-average molecular weight of 12,000 and an acid value of the solid of 39.9 mgKOH/g.

<Production of Carboxyl Group-Containing Polyurethane According to Above-Mentioned Method 3>

[Synthesis of Polyurethane Having Terminal Isocyanate Groups]

Synthetic Example 3-1-1

A reaction vessel equipped with a stirrer, a thermometer and a condenser was charged with 683.8 g of C-1090 (manufactured by KURARAY CO., LTD. polycarbonate diol, a molar ratio of the raw material diol compounds: 1,6-hexanediol: 3-methyl-1,5-pentanediol=10:90, Mw=992) as the polyol compound of Group I, 132.5 g of carboxyl group-containing dihydroxy compound 2,2-dimethylolbutanoic acid (manufactured by Nippon Kasei. Chemical Co., Ltd.), and 1254 g of diethylene glycol ethylether acetate (a product Of DAICEL CHEMICAL INDUSTRIES, LTD.) as solvent. The 2,2-dimethylolbutanoic acid was dissolved at 90° C.

The reaction liquid was cooled to 70° C., and 437.3 g of polyisocyanate DESMODULE-W (manufactured by Sumika Bayer Urethane Co., Ltd.) was added dropwise with a dropping funnel over a period of 30 minutes. After the completion of dropping, reaction was performed at 80° C. for 1 hour, at 100° C. for 1 hour, and further at 110° C. for 2 hours. The reaction solution was taken out. An amount of remaining isocyanate group in 1 g of the resulting polyurethane was calculated to be 0.133 mmol/g from the molar ratio of usage.

Synthetic Examples 3-1-2 to 3-1-5

Other polyurethanes having isocyanate groups at the terminals were synthesized in the same manner as in Synthetic Example 3-1-1, except for the compositions and blending ratios as shown in Table 2. Table 2 also shows the properties of the resulting polyurethanes having isocyanate groups at both ends.

(Synthesis of Polyurethane Having Isocyanate Groups at Both Ends)

Synthetic Example 3-2-1

A reaction vessel equipped with a stirrer, a thermometer and a condenser was charged with 721.7 g of G-1000 (manufactured by Nippon Soda Co., Ltd., 1,2-polybutadiene having hydroxyl groups at both ends, Mw=1548) as the polyol compound of Group II, 116.1 g of carboxyl group-containing dihydroxy compound 2,2-dimethylolbutanoic acid (Nippon Kasei Chemical Co., Ltd.), and 1100 g of diethylene glycol ethylether acetate (manufactured by DAICEL CHEMICAL INDUSTRIES, LTD.) as solvent. The 2,2-dimethylolbutanoic acid was dissolved at 90° C.

The reaction liquid was cooled to 70° C., and 262.4 g of polyisocyanate DESMODULE-W (manufactured by Sumika Bayer Urethane Co., Ltd.), was added dropwise with a dropping funnel over a period of 30 minutes. After the completion of dropping addition, reaction was performed at 80° C. for 1 hour, at 100° C. for 1 hour, and at 110° C. for 2 hours. The reaction solution was taken out. An amount of remaining hydroxyl group in 1 g of the resulting polyurethane was calculated to be 0.454 mmol/g from the molar ratio of usage.

Synthetic Examples 3-2-2 to 3-2-4

Other polyurethanes having terminal hydroxyl groups were synthesized in the same manner as in Synthetic Example 3-2-1, except for the compositions and the blending ratios as shown in Table 3. Table 3 also shows the properties of the resulting polyurethanes having terminal hydroxyl groups.

Synthetic Example 3-1

A reaction vessel equipped with a stirrer, a thermometer and a condenser was charged with 200 g of the polyurethane having terminal isocyanate groups obtained in Synthetic Example 3-1-1 and 58.6 g of the polyurethane having terminal hydroxyl groups obtained in Synthetic Example 3-2-1. Reaction was performed at 120° C. for 5 hours. When the substantial disappearance of the isocyanate was confirmed, 5 g of isobutanol (manufactured by Wako Pure Chemical Industries, Ltd.) was added dropwise and then, reaction was further performed at 120° C. for 1.5 hours.

The carboxyl group-containing polyurethane obtained had a number-average molecular weight of 12, 100 and an acid value of the solid of 42.7 mgKOH/g.

Synthetic Example 3-2 to 3-5

Other carboxyl group-containing polyurethanes were synthesized in the same manner as in Synthetic Example 3-1, except for the compositions and the blending ratios, as shown in Table 4. Table 4 also shows the properties of the resulting carboxyl group-containing polyurethanes.

<Production of Carboxyl Group-Containing Polyurethane According to Above-Mentioned Method 4>

(Carboxyl Group-Containing Polyurethane Based on Polyol Compound of Group I.)

Synthetic Example 4-1-1

A reaction vessel equipped with a stirrer, a thermometer and a condenser was charged with 805.4 g of polycarbonate diol C-1015N (manufactured by KURARAY CO., LTD. polycarbonate diol, a molar ratio of the raw material diol compounds: 1,9-nonanediol:2-methyl-1,8-octanediol=15:85, Mw=964), 104.2 g of carboxyl group-containing dihydroxy compound 2,2-dimethylolbutanoic acid (manufactured by Nippon Kasei Chemical Co., Ltd.), and 1307 g of diethylene glycol ethylether acetate (manufactured by DAICEL CHEMICAL INDUSTRIES, LTD.) as solvent. The materials were dissolved at 90° C.

The reaction liquid was cooled to 70° C., and 403.6 g of DESMODULE-W (manufactured by Sumika Bayer Urethane Co., Ltd.), as the polyisocyanate was added dropwise with a dropping funnel over a period of 30 minutes. After the completion of dropwise addition, reaction was performed at 80° C. for 1 hour, at 100° C. for 1 hour, and at 120° C. for 2 hours. When the substantial disappearance of the isocyanate was confirmed, 5.7 g of isobutanol (manufactured by Wako Pure Chemical Industries, Ltd.) was added dropwise and reaction was further performed at 125° C. for 1.5 hours.

The carboxyl group-containing polyurethane obtained had a number-average molecular weight of 12,100 and an acid value of the solid of 30.1 mgKOH/g.

Synthetic Example 4-1-2 to 4-1-10

Other carboxyl group-containing polyurethanes based on the polyol compound of Group I were synthesized in the same manner as in Synthetic Example 4-1-1 except for the compositions and the blending ratios as shown in Table 5. Table 5 also shows the properties of the resulting polyurethanes.

(Carboxyl Group-Containing Polyurethane Based on Polyol Compound of Group II)

Synthetic Example 4-2-1

A reaction vessel equipped with a stirrer, a thermometer and a condenser was charged with 704.0 g of polybutadiene diol G-1000 (manufactured by NIPPON SODA CO., LTD.), 148.2 g of carboxyl group-containing dihydroxy compound 2,2-dimethylolbutanoic acid (manufactured by Nippon Kasei Chemical Co., Ltd.), and 1293 g of diethylene glycol ethylether acetate (manufactured by DAICEL CHEMICAL INDUSTRIES, LTD.), as solvent. The materials were dissolved at 90° C.

The reaction liquid was cooled to 70° C., and 423.1 g of DESMODULE-W (manufactured by Sumika Bayer Urethane Co., Ltd.), as the polyisocyanate was added dropwise with a dropping funnel over a period of 30 minutes. After the completion of the dropwise addition, reaction was performed at 80° C. for 1 hour, at 100° C. for 1 hour, and at 120° C. for 2 hours. When the substantial disappearance of the isocyanate was confirmed, 6.0 g of isobutanol (manufactured by Wako Pure Chemical Industries, Ltd.) was added dropwise and reaction was further performed at 125° C. for 2 hours.

The carboxyl group-containing polyurethane obtained had a number-average molecular weight of 14,200 and an acid value of the solid of 49.8 mgKOH/g.

Synthetic Examples 4-2-2 to 4-2-7

Other carboxyl group-containing polyurethanes based on the polyol compound of Group II were synthesized in the same manner as in Example 4-2-1, except for the compositions and the blending ratios, as shown in Table 6. Table 6 also shows the properties of the resulting polyurethanes.

[Evaluation of Thermosetting Resin Compositions for Overcoating]

<Preparation of Film Forming Material>

Example 1

100 g of the carboxyl group-containing polyurethane solution obtained in the Synthetic Example 1-1 (a solid content 50 wt %; an acid value 40.2 mg KOH/g), 9.63 g of Epikote 834 (manufactured by Japan Epoxy Resins Co., Ltd., an epoxy equivalent of 245), 1 g of melamine, 5.0 g of Aerosil R-974 (manufactured by NIPPON AEROSIL CO., LTD.), and 0.75 g of KS-66 (manufactured by Shin-Etsu Chemical Co., Ltd.) as anti-foaming agent were blended and kneaded by being passed through a three-roll mill (RIII-1 RM-2 manufactured by Kodaira Seisakusho Co., Ltd.) to prepare a thermosetting resin composition.

Examples 2 to 15

Thermosetting resin compositions were prepared in the same manner as in Example 1, except for the compositions and blending ratios as shown in Table 7.

Comparative Examples 1 and 2

Thermosetting resin compositions were also prepared in the same manner as in Example 1, except for the compositions and blending ratios as shown in Table 7.

<Evaluation of the Cured Product>

The thermosetting resin composition obtained by Example 1 was applied on a substrate by screen printing through a polyester mesh #100, and evaluated for tackiness at high temperature, adhesion, warpage, flexibility, plating resistance, soldering heat resistance, and long-term reliability of electric insulation under the following condition. The test results are shown in Table 7.

[Tackiness at High Temperature]

The substrate used was a 75 μm thick polyimide film (KAPTON® 300H, manufactured by DUPONT-TORAY CO., LTD.). The screen printed film was dried at 80° C. for 30 minutes and cured at 120° C. for 90 minutes. The heat-cured film was cut to a square 2 cm on a side, and put on a hot plate preheated with the resist side (surface protection film side) upside.

A square polyethylene terephthalate (PET) film with 1.8 $cm^2$ of the bottom area, and a weight (18 g) were put on the upper surface of the surface protection film (resist) in this order and heated at a set temperature for 1 minute, so that it was observed whether the PET film was adhered to the resist surface or not.

Table 7 shows the temperatures at which the PET film was adhered to the resist, wherein, when the adhesion was not observed even at 100° C., the test result was shown as more than 100° C. (>100° C.

[Adhesion]

The substrate used was a 75 μm thick polyimide film (KAPTON® 300H, manufactured by DUPONT-TORAY CO., LTD.). The screen printed film was dried at 80° C. for 30 minutes and cured at 150° C. for 1 hour. The heat-cured film was subjected to the cross-cut test according to JIS K 5600.

[Warpage]

The substrate used was a 75 μm thick polyimide film (KAPTON® 300H, manufactured by DUPONT-TORAY CO., LTD.). The screen printed film was dried at 80° C. for 30 minutes and cured at 150° C. for 1 hour. The cured film was cut a circle 50 mm in diameter. The circle film was placed with the printed surface upside and was evaluated based on the following criteria.

AA: Maximum warp was less than 5 mm high.

CC: Maximum warp was not less than 5 mm high.

[Flexibility]

The substrate used was a 75 μm thick polyimide film (KAPTON® 300H, manufactured by DUPONT-TORAY CO., LTD.). The screen printed film was dried at 80° C. for 30 minutes and cured at 150° C. for 1 hour. The polyimide film with the heat-cured solder resist ink was bent 180° with the coated surface outward, and the occurrence of blushing in the cured film was checked. The flexibility was evaluated based on the following criteria.

AA: No blushing occurred in the cured film.

CC: Blushing or cracks occurred in the cured film.

[Plating Resistance]

The substrate used was a printed board (UPICEL® N manufactured by UBE INDUSTRIES, LTD.) consisting of a polyimide film (50 μm thick) and a copper foil (35 μm thick) on one surface of the polyimide film. This substrate had been washed with acid degreasing agent AC-401 and rinsed with water, followed by drying at 70° C. for 3 minutes. After the screen printing, the thermosetting resin composition was dried at 80° C. for 30 minutes, and cured at 150° C. for 1 hour, followed by rinsing with water. The board was soaked in acid degreasing agent ICP Clean 91 at 23° C. for 1 minute, rinsed with water, soaked in a 10% aqueous sulfuric acid solution at 23° C. for 1 minute, and rinsed with water. Thereafter, the board was soaked in a tin plating solution (TINPOSIT LT-34, manufactured by Rohm and Hass Company) at 70° C. for 3 minutes, rinsed with water, and soaked in warm water at 70° C. for 3 minutes. The plated board was heat treated at 120° C. for 2 hours, and the cured film was visually observed. The plating resistance was evaluated based on the following criteria.

AA: The cured film did not change color, and the plating solution did not intrude under the cured film.

BB: The plating solution intruded under the cured film, but the cured film did not change color.

CC: The cured film changed color, or the plating solution intruded under the cured film.

[Solder Heat Resistance]

The solder heat resistance was evaluated according to the JIS C 6481 test method. The substrate used was a printed board (UPICEL® N manufactured by UBE INDUSTRIES, LTD.) consisting of a polyimide film (50 μm thick) and a copper foil (35 μm thick) on one surface of the polyimide film. This substrate had been washed with a 1% aqueous sulfuric acid solution, rinsed with water and air dried. After the screen printing, the thermosetting resin was dried at 80° C. for 30 minutes, and cured at 150° C. for 1 hour. The substrate with the heat-cured thermosetting resin was floated in a 260° C. solder bath for 10 seconds, and the cured film was visually observed. The soldering heat resistance was evaluated based on the following criteria.

AA: The cured film did not swell, and the solder did not intrude under the cured film.

CC: The cured film swelled, or the solder intruded under the cured film.

[Long-Term Reliability of Electric Insulation]

The substrate used was a comb-shaped board (the width of the copper wiring/the pitch of the copper wirings=50 μm/50 μm) made by etching the flexible copper-clad laminate (UPICEL®N BE1310 manufactured by UBE INDUSTRIES, LTD.). After the screen printing, the thermosetting resin was dried at 80° C. for 30 minutes, and cured at 150° C. for 1 hour. The substrate was exposed to 85° C. and 85% RH, and a bias voltage of 100 V was applied to the substrate for 1000 hours. The electrical insulating properties were evaluated based on the following criteria.

AA: No migration and no decrease in insulation resistance resulted.

CC: Migration or decreased insulation resistance resulted within 1000 hours.

TABLE 1

| Raw Material | | | | Synthetic Example | | | | | |
| --- | --- | --- | --- | --- | --- | --- | --- | --- | --- |
| Group | Trade name | Content | | 1-1 | 1-2 | 1-3 | 1-4 | 1-5 | 1-6 |
| Group (I) | C-1015N | KURARAY CO., LTD.; Polycabonate diol; Raw diol molar ratio: 1,9-Nonanediol/2-Methyl-1,8-octanediol = 15/85; Mw = 964 | Weight of usage (g) | 660.6 | 539.8 | 480.2 | 660.9 | | |
| | C-1065N | KURARAY CO., LTD.; Polycarbonate diol; Raw diol molar ratio: 1,9-Nonanediol/2-Methyl-1,8-octanediol = 65/35; Mw = 991 | | | | | | | 624.3 |
| | C-1090 | KURARAY CO., LTD.; Polycarbonate diol; Raw diol molar ratio: 1,6-Hexanediol/3-Methyl-1,5-pentanediol = 10/90; Mw = 992 | | | | | | | |
| | PCDL T4691 | Asahi Kasei Chemicals Corporation; Poly-carbonate diol; Raw diol molar ratio: 1,4-Butanediol/1,6-Hexanediol = 90/10; Mw = 1033 | | | | | | 573.4 | |
| | UM-CARB90 (3/1) | UBE INDUSTRIES, LTD.; Polycarbonate diol; Raw diol molar ratio: 1,6-Hexanediol/1,4-Cyclohexane dimethanol = 25/75; Mw = 907 | | | | | | | |
| | KYOWAPOL 1000BA | KYOWA HAKKO CHEMICAL CO., LTD.; Polyester polyol; Polyester from Butyl ethyl propanediol and | | | | | | | |

TABLE 1-continued

| | | | | | | | | |
|---|---|---|---|---|---|---|---|---|
| | | Adipic acid; Mw = 1039 | | | | | | |
| | KURARAY Polyol P-2030 | KURARAY CO., LTD.; Polyester polyol; Raw material: 3-Methyl-1,5-pentanediol + Isophthalic acid; Mw = 2094 | | | | | | |
| | PTMG1000 | Mitsubishi Chemical Corp.; Polyether polyol; Polytera-methyleneglycol, Mw = 1014 | | | | | | |
| | PTXG-1000 | Asahi Kasei Fibers Corporation; Polyether polyol; Copolymer of 1,4-Butanediol + Neopentylglycol; Mw = 1017 | | | | | | |
| Group (II) | G-1000 | Nippon Soda Co., Ltd.; 1,2-Polybutadiene having hydroxyl groups at both ends; Mw = 1548 | 73.4 | | | | 61.6 | |
| | GI-1000 | Nippon Soda Co., Ltd.; Hydrogenated 1,2-polybutadiene having hydroxyl groups at both ends; Mw = 1729 | | 120.8 | | | | |
| | Poly bd R-15HT | Idemitsu Kosan Co., Ltd.; Polybutadiene having hydroxyl groups at both ends (1,4-Unit 80%); Mw = 1105 | | | | | | 66.3 |
| | Poly IP | Idemitsu Kosan Co., Ltd.; Terminal hydroxylated polyisoprene; Mw = 2439 | | | | | | |
| | SOVERMOL 908 | Cognis Japan Ltd.; Hydrogenated dimer diol; Mw = 537 | | | 137.1 | | | |
| | X-22-160AS | Shin-Etsu Chemical Co., Ltd.; Polysilicone having hydroxyl groups at both ends; Mw = 976 | | | | 12.5 | | |
| | KF-6001 | Shin-Etsu Chemical Co., Ltd.; Polysilicone having hydroxyl groups at both ends; Mw = 1840 | | | | | | |
| Carboxyl group-containing diol | Dimethylol butanoic acid | | 138.4 | 126.5 | 134.7 | 130.4 | 110.3 | |
| | Dimethylol propionic acid | | | | | | | 123.4 |
| Polyiso-cyanate | DESMODULE-W | Sumika Bayer Urethane Co., Ltd.; Methylene-bis(cyclohexyl isocyanate) | 437.3 | 389.3 | 501.1 | 411.8 | 279.1 | |
| | DESMODULE-I | Sumika Bayer Urethane Co., Ltd.; Isophorone diisocyanate | | | | | | |
| | TAKENATE 600 | Mitsui Takeda Chemicals, Inc.; Cyclohexane-1,3-dimethylene diisocyanate | | | | | | |
| | COSMONATE PH | Mitsui Takeda Chemicals, Inc.; Diphenylmethane-4,4'-diisocyanate (MDI) | | | | | | 475.5 |
| | COSMONATE T-80 | Mitsui Takeda Chemicals, Inc.; Tolylene diisocyanate | | | | | | |

TABLE 1-continued

| | | | | | | | | |
|---|---|---|---|---|---|---|---|---|
| Mono-hydroxy compound | Isobutanol | (TDI); Ratio (2,4-/ 2,6- = 80/20) Wako Pure Chemical Industries, Ltd.; Special grade chemicals | 5.0 | 5.0 | 5.0 | 5.0 | 5.0 | |
| | HEA | Osaka Organic Chemial Industry Ltd.; 2-Hydroxyethyl acrylate | | | | | | |
| | CHDMMA | Nippon Kasei Chemical Co., Ltd.; 1,4-Cyclohexane dimethanol monoacrylate | | | | | | 4.0 |
| Mono-iscyanate compound | MOI | Showa Denko K.K.; 2-Isocyanate ethyl methacrylate | | | | | | |
| | AOI | Showa Denko K.K.; 2-Isocyanate ethyl acrylate | | | | | | |
| Solvent | Diethylene glycol ethylether acetate | DAICEL CHEMICAL INDUSTRIES, LTD. | 1303 | 1190 | 1270 | | | 1293 |
| | γ-Butyrolactone | Mitsubishi Chemical Corporation | | | | 1231 | 1044 | |
| Property | Number-average molecular weight | | 1.38E+04 | 1.13E+04 | 1.12E+04 | 1.23E+04 | 1.08E+04 | 9.50E+03 |
| | Acid value (mg KOH/g) | | 40.2 | 40.1 | 40.3 | 39.7 | 40.1 | 39.9 |

| Raw Material | | Synthetic Example | | | | | |
|---|---|---|---|---|---|---|---|
| Group | Trade Name | 1-7 | 1-8 | 1-9 | 1-10 | 1-11 | 1-12 |
| Group (I) | C-1015N | | | | | | |
| | C-1065N | | | | | | |
| | C-1090 | | | | | | |
| | PCDL T4691 | | | | | 619.8 | |
| | UM-CARB90 (3/1) | | | | | | 254.3 |
| | KYOWAPOL 1000BA | 436.4 | | | | | |
| | KURARAY Polyol P-2030 | | | | | | |
| | PTMG1000 | | | | | | |
| | PTXG-1000 | | 488.2 | 508.3 | 610.6 | | |
| Group (II) | G-1000 | | | | | 77.2 | 369.6 |
| | GI-1000 | | | | | | |
| | Poly bd R-15HT | | | 56.1 | | | |
| | Poly IP | | | | 73.0 | | |
| | SOVERMOL 908 | 131.5 | | | | | |
| | X-22-160AS | | | | | | |
| | KF-6001 | | 110.4 | | | | |
| Carboxyl group-containing diol | Dimethylol butanoic acid | 108.6 | 108.5 | 109.0 | 120.9 | | 116.9 |
| | Dimethylol propionic acid | | | | | 102.4 | |
| Polyiso-cyanate | DESMODULE-W | 333.7 | 306.8 | 339.8 | | | 345.1 |
| | DESMODULE-I | | | | 325.0 | | |
| | TAKENATE 600 | | | | | | |
| | COSMONATE PH | | | | | | |
| | COSMONATE T-80 | | | | | 262.7 | |
| Mono-hydroxy compound | Isobutanol | | | 5.0 | 5.0 | | 5.0 |
| | HEA | | | | | 12.3 | |
| | CHDMMA | | | | | | |
| Mono-iscyanate compound | MOI | 18.6 | 18.6 | | | | |
| | AOI | | | | | | |
| Solvent | Diethylene glycol ethylether | 1029 | 1028 | 1064.6 | 1146 | | 1106 |

TABLE 1-continued

| | | | | | | | | |
|---|---|---|---|---|---|---|---|---|
| | | acetate | | | | | | |
| | | γ-Butyrolactone | | | | | | 1075 |
| | Property | Number-average molecular weight | 9.50E+03 | 8.43E+3 | 9.40E+03 | 9.50E+03 | 1.08E+04 | 9.05E+03 |
| | | Acid value (mg KOH/g) | 39.8 | 39.8 | 40.2 | 40.1 | 39.8 | 39.9 |

TABLE 2

| Raw material | | | | Synthetic Example | | | | |
|---|---|---|---|---|---|---|---|---|
| Group | Trade name | Content | | 3-1-1 | 3-1-2 | 3-1-3 | 3-1-4 | 3-1-5 |
| Group (I) | C-1015N | KURARAY CO., LTD. Polycarbonate diol; Raw diol molar ratio: 1,9-Nonanediol/2-Methyl-1,8-octanediol = 15/85; Mw = 964 | Weight of usage (g) | | | | | 636.2 |
| | C-1065N | KURARAY CO., LTD. Polycarbonate diol; Raw diol molar ratio: 1,9-Nonanediol/2-Methyl-1,8-octanediol = 65/35; Mw = 991 | | | | | | |
| | C-1090 | KURARAY CO., LTD. Polycarbonate diol; Raw diol molar ratio: 1,6-hexanediol/3-Methyl-1,5-pentanediol = 10/90; Mw = 992 | | 683.8 | | | | |
| | PCDL T4691 | Asahi Kasei Chemicals Corporation; Polycarbonate diol; Raw diol molar ratio: 1,4-Butanediol/1,6-Hexanediol = 90/10; Mw = 1033 | | | | | | |
| | UM-CARB90 (3/1) | UBE INDUSTRIES, LTD. Polycarbonate diol; Raw diol molar ratio: 1,6-Hexanediol/1,4-Cyclohexane dimethanol = 25/75; Mw = 907 | | | | | | |
| | KYOWAPOL 1000BA | KYOWA HAKKO CHEMICAL CO., LTD.; Polyester polyol; Polyester from Butyl ethyl propanediol and Adipic acid; Mw = 1039 | | | | | | |
| | KURARAY Polyol P-2030 | KURARAY CO., LTD.; Polyester polyol; Raw material: 3-Methyl-1,5-pentanediol + Isophthalic acid; Mw = 2094 | | | | | | |
| | PTMG1000 | Mitsubishi Chemical Corp.; Polyether polyol; Polytetramethylene glycol, Mw = 1014 | | | | | | |
| | PTXG-1000 | Asahi Kasei Fibers Corporation; Polyether polyol; Copolymer of 1,4-Butadiene diol + Neopentyl glycol; Mw = 1017 | | | | | | |
| Group (II) | G-1000 | Nippon Soda Co., Ltd.; 1,2-Polybutadiene having hydroxyl groups at both ends, Mw = 1548 | | | 92.3 | | 37.0 | |
| | GI-1000 | Nippon Soda Co., Ltd.; Hydrogenated 1,2-polybutadiene having hydroxyl groups at both ends; Mw = 1729 | | | | 103.7 | | |

TABLE 2-continued

| Group | Raw material Trade name | Content | 3-1-1 | 3-1-2 | 3-1-3 | 3-1-4 | 3-1-5 |
|---|---|---|---|---|---|---|---|
| | Poly bd R-15HT | Idemitsu Kosan Co., Ltd.; Polybutadiene having hydroxyl groups at both ends (1,4-Unit 80%); Mw = 1105 | | | | | |
| | Poly IP | Idemitsu Kosan Co., Ltd.; Polyisoprene having hydroxyl groups at both ends; Mw = 2439 | | | | | |
| | SOVERMOL 908 | Cognis Japan Ltd.; Hydrogenated dimer diol; Mw = 537 | | | | | |
| | X-22-160AS | Shin-Etsu Chemical Co., Ltd.; Polysilicone having hydroxyl groups at both ends; Mw = 976 | | | | | |
| | KF-6001 | Shin-Etsu Chemical Co., Ltd.; Polysilicone having hydroxyl groups at both ends; Mw = 1840 | | | | | |
| Carboxyl group-containing diol | Dimethylol butanoic acid | | 132.5 | 20.1 | 20.1 | 6.3 | 124.6 |
| | Dimethylol propionic acid | | | | | | |
| Polyiso-cyanate | DESMODULE-W | Sumika Bayer Urethane Co., Ltd.; Methylene-bis(cyclohexyl isocyanate) | 437.3 | 68.9 | 68.9 | 26.1 | 490.7 |
| | DESMODULE-I | Sumika Bayer Urethane Co., Ltd.; Isophorone diisocyanate | | | | | |
| | TEKENATE 600 | Mitsui Takeda Chemicals, Inc.; Cyclohexane-1,3-dimethylene diisocyanate | | | | | |
| Solvent | Diethylene glycol ethylether acetate | DAICEL CHEMICAL INDUSTRIES, LTD. | 1254 | 181 | 192 | 70 | |
| | γ-Butyrolactone | Mitsubishi Chemical Corporation | | | | | 1254 |
| Terminal isocyanate group (Calculated value) mmol/g | | | 0.133 | 0.579 | 0.545 | 0.517 | 0.295 |

TABLE 3

| Group | Raw material Trade name | Content | | 3-2-1 | 3-2-2 | 3-2-3 | 3-2-4 |
|---|---|---|---|---|---|---|---|
| Group (I) | C-1015N | KURARAY CO., LTD.; Poly-carbonate diol; Raw diol molar ratio: 1,9-Nonanediol/2-Methyl-1,8-octanediol = 15/85; Mw = 964 | Weight of usage (g) | | 717.2 | 607.3 | |
| | C-1065N | KURARAY CO., LTD.; Poly-carbonate diol; Raw diol molar ratio: 1,9-Nonanediol/2-Methyl-1,8-octanediol = 65/35; Mw = 991 | | | | | |
| | C-1090 | KURARAY CO., LTD.; Poly-carbonate diol; Raw diol molar ratio: 1,6-hexanediol/3-Methyl-1,5-pentanediol = 10/90; Mw = 992 | | | | | |
| | PCDL T4691 | Asahi Kasei Chemicals Corporation; Polycar-bonate diol; Raw diol molar ratio: 1,4-Butanediol/1,6- | | | | | |

TABLE 3-continued

| Group | Raw material Trade name | Content | Synthetic Example 3-2-1 | 3-2-2 | 3-2-3 | 3-2-4 |
|---|---|---|---|---|---|---|
| | UM-CARB90 (3/1) | Hexanediol = 90/10; Mw = 1033 UBE INDUSTRIES, LTD.; Polycarbonate diol; Raw diol molar ratio: 1,6-Hexanediol/1,4-Cyclohexane dimethanol = 25/75; Mw = 907 | | | | |
| | KYOWAPOL 1000BA | KYOWA HAKKO CHEMICAL CO., LTD.; Polyester polyol; Polyester from Butyl ethyl propanediol and Adipic acid; Mw = 1039 | | | | |
| | KURARAY Polyol P-2030 | KURARAY CO., LTD.; Polyester polyol; Raw Material: 3-Methyl-1,5-pentanediol + Isophthalic acid; Mw = 2094 | | | | |
| | PTMG1000 | Mitsubishi Chemical Corp.; Polyether polyol; Polytetramethylene glycol, Mw = 1014 | | | | |
| | PTXG-1000 | Asahi Kasei Fibers Corporation; Polyether polyol; Copolymer of 1,4-Butadienediol and Neopentyl glycol; Mw = 1017 | | | | |
| Group (II) | G-1000 | Nippon Soda Co., Ltd.; 1,2-Polybutadiene having hydroxyl groups at both ends, Mw = 1548 | 721.7 | | | 769.5 |
| | GI-1000 | Nippon Soda Co., Ltd.; Hydrogenated 1,2-polybutadiene having hydroxyl groups at both ends; Mw = 1729 | | | | |
| | Poly bd R-15HT | Idemitsu Kosan Co., Ltd.; Polybutadiene having hydroxyl groups at both ends (1,4-Unit 80%); Mw = 1105 | | | | |
| | Poly IP | Idemitsu Kosan Co., Ltd.; Polyisoprene having hydroxyl groups at both ends; Mw = 2439 | | | | |
| | Epol | Idemitsu Kosan Co., Ltd.; Hydrogenated polyisoprene having hydroxyl groups at both ends; Mw = 2247 | | | | |
| | SOVERMOL 908 | Cognis Japan Ltd.; Hydrogenated dimer diol; Mw = 537 | | | | |
| | X-22-160AS | Shin-Etsu Chemical Co., Ltd.; Polysilicone having hydroxyl groups at both ends; Mw = 976 | | | | |
| | KF-6001 | Shin-Etsu Chemical Co., Ltd.; Polysilicone having hydroxyl groups at both ends; Mw = 1840 | | | | |
| Carboxyl group-containing diol | Dimethylol butanoic acid Dimethylol propionic acid | | 116.1 | 133.3 | 103.7 | 118.4 |
| Polyisocyanate | DESMODULE-W | Sumika Bayer Urethane Co., Ltd.; Methylene-bis(cyclohexyl-isocyanate) | 262.4 | 409.7 | 279.2 | |
| | DESMODULE-I | Sumika Bayer Urethane Co., Ltd.; Isophorone diisocyanate | | | | |

TABLE 3-continued

| Raw material | | | Synthetic Example | | | |
|---|---|---|---|---|---|---|
| Group | Trade name | Content | 3-2-1 | 3-2-2 | 3-2-3 | 3-2-4 |
| | NBDI TEKENATE 600 | Mitsui Takeda Chemicals, Inc.; Cyclohexane-1,3-dimethylene diisocyanate | | | | 201.3 |
| Solvent | Diethylene glycol Ethylether acetate | DAICEL CHEMICAL INDUSTRIES, LTD. | 1100 | | 991.1 | 1093 |
| | γ-Butyrolactone | Mitsubishi Chemical Corporation | | 1260 | | |
| Terminal hydroxyl group (Calculated value) mmol/g | | | 0.454 | 0.130 | 0.537 | 0.468 |

TABLE 4

| Content | | Functional group concentration, calcd., mmol/g | Synthetic Example | | | | |
|---|---|---|---|---|---|---|---|
| | | | 3-1 | 3-2 | 3-3 | 3-4 | 3-5 |
| Isocyanate terminal | Synthetic Example 3-1-1 | 0.133 | 200 | | | | |
| | Synthetic Example 3-1-2 | 0.579 | | 112.6 | | | |
| | Synthetic Example 3-1-3 | 0.545 | | | 119.6 | | |
| | Synthetic Example 3-1-4 | 0.517 | | | | | 20 |
| | Synthetic Example 3-1-5 | 0.295 | | | | | 200 |
| Hydroxyl group terminal | Synthetic Example 3-2-1 | 0.454 | 58.6 | | | | |
| | Synthetic Example 3-2-2 | 0.13 | | 500 | 500 | | |
| | Synthetic Example 3-2-3 | 0.537 | | | | 200 | |
| | Synthetic Example 3-2-4 | 0.468 | | | | 20 | |
| Polyol | C-1015N | | | | | | |
| | G-1000 | | | | | | |
| | DMBA (2,2-Dimethylol butanoic acid) | | | | | | 10.3 |
| Polyisocyanate | DESMODULE-W TAKENATE 600 | | | | | 7.6 | |
| Monohydroxy compound | Isobutanol | | 5 | 5 | 5 | 2 | 2 |
| Property | Number-ave. MW | | 8.90E+03 | 1.09E+04 | 9.30E+03 | 9.10E+03 | 9.70E+03 |
| | Acid value (mg KOH/g) | | 42.7 | 40.4 | 40.3 | 36.5 | 68.9 |

TABLE 5

| Raw material | | | Synthetic Example | | | | |
|---|---|---|---|---|---|---|---|
| Group | Trade name | Content | | 4-1-1 | 4-1-2 | 4-1-3 | 4-1-4 | 4-1-5 |
| Group (I) | C-1015N | KURARAY CO., LTD.; Polycarbonate diol; Raw diol molar ratio: 1,9-Nonanediol/2-Methyl-1,8-octanediol = 15/85; Mw = 964 | Weight of usage (g) | 805.4 | | | | 763.6 |
| | C-1065N | KURARAY CO., LTD.; Polycarbonate diol; Raw diol molar ratio: 1,9-Nonanediol/2-Methyl-1,8-octanediol = 65/35; Mw = 91 | | | | 651.0 | | |
| | C-1090 | KURARAY CO., LTD.; Polycarbonate diol; Raw diol | | | | | | |

TABLE 5-continued

| | | | | | | | |
|---|---|---|---|---|---|---|---|
| | | molar ratio: 1,6-hexanediol/3-Methyl-1,5-pentanediol = 10/90; Mw = 992 | | | | | |
| | PCDL T4691 | ASAHI KASEI CHEMICALS CORPORATION; Polycarbonate diol; Raw diol molar ratio: 1,4-Butanediol/1,6-Hexanediol = 90/10; Mw = 1033 | | 865.1 | | | |
| | UM-CARB90 (3/1) | UBE INDUSTRIES, LTD.; Polycarbonate diol; Raw diol molar ratio: 1,6-Hexanediol/1,4-Cyclohexane dimethanol = 25/75; Mw = 907 | | | | 548.2 | |
| | KYOWAPOL 1000BA | KYOWA HAKKO CHEMICAL CO., LTD.; Polyester polyol; Polyester of Butyl ethyl propanediol and Adipic acid; Mw = 1039 | | | | | |
| | KURARAY Polyol P-2030 | KURARAY CO., LTD.; Polyester polyol; Raw material: 3-Methyl-1,5-pentanediol + Isophthalic acid; Mw = 2094 | | | | | |
| | PTMG1000 | Mitsubishi Chemical Corp.; Polyether polyol; Polytetramethylene glycol, Mw = 1014 | | | | | |
| | PTXG-1000 | Asahi Kasei Fibers Corporation; Polyether polyol; Copolymer of 1,4-Butadienediol and Neopentyl glycol; Mw = 1017 | | | | | |
| Carboxyl group-Containing Diol | Dimethylol butanoic acid | | 104.2 | 87.7 | | 103.8 | 130.4 |
| | Dimethylol propionic acid | | | | 112.4 | | |
| Polyisocyanate | DESMODULE-W | Sumika Bayer Urethane Co., Ltd.; Methylene-bis(cyclohexylisocyanate) | 403.6 | 374.0 | 392.1 | 343.2 | |
| | DESMODULE-I | Sumika Bayer Urethane Co., Ltd.; Isophorone diisocyanate | | | | | |
| | NBDI | MITSUI FINE CHEMICALS, INC.; Norbornane diisocyanate | | | | | |
| | TEKENATE 600 | Mitsui Takeda Chemicals, Inc.; Cyclohexane-1,3-dimethylene diisocyanate | | | | | 327.6 |
| | COSMONATE PH | Mitsui Takeda Chemicals, Inc.; Diphenylenemethane-4,4'-diisocyanate (MDI) | | | | | |
| Mono-Hydroxy compound | Isobutanol | Wako Pure Chemical Industries; Special grade chemicals | 5.7 | 5.3 | 5.2 | 4.8 | 5.8 |
| | CHDMMA | Nippon Kasei Chemical Co., Ltd.; 1,4-Cyclohexanedimethanol monoacrylate | | | | | |
| Solvent | Diethylene glycol ethylether acetate | DAICEL CHEMICAL INDUSTRIES, LTD. | 1307 | | 1172 | 1014 | 1236 |
| | γ-Butyrolactone | Mitsubishi Chemical Corporation | | 1321 | | | |
| Property | Number-average molecular weight | | 1.21E+04 | 1.44E+04 | 1.11E+04 | 9.86E+03 | 1.26E+04 |
| | Acid value (mg KOH/g) | | 30.1 | 25.2 | 40.1 | 40.3 | 40.4 |

TABLE 5-continued

| Raw material | | | Synthetic Example | | | | |
|---|---|---|---|---|---|---|---|
| Group | Trade name | | 4-1-6 | 4-1-7 | 4-1-8 | 4-1-9 | 4-1-10 |
| Group (I) | C-1015N | | | | | | |
| | C-1065N | | | | | | |
| | C-1090 | | 595.2 | | | | |
| | PCDL T4691 | | | | | | |
| | UM-CARB90 (3/1) | | | | | | |
| | KYOWAPOL 1000BA | | | | | | 623.4 |
| | KURARAY Polyol P-2030 | | | 879.5 | | | |
| | PTMG1000 | | | | | 608.4 | |
| | PTXG-1000 | | | | | | 610.2 |
| Carboxyl group-Containing Diol | Dimethylol butanoic acid | | 102.2 | 104.9 | 106.7 | 115.6 | 115.6 |
| | Dimethylol propionic acid | | | | | | |
| Polyiso-cyanate | DESMODULE-W | | | | | 362.0 | |
| | DESMODULE-I | | | | 293.4 | | |
| | NBDI | | 266.0 | | | | |
| | TEKENATE 600 | | | | | | |
| | COSMONATE PH | | | 312.3 | | | 345.3 |
| Mono-Hydroxy compound | Isobutanol | | 5 | | 5 | 5 | 5 |
| | CHDMMA | | | 2.38 | | | |
| Solvent | Diethylene glycol ethylether acetate | | | 1321 | 1014 | | 1089 |
| | γ-Butyrolactone | | 969 | | | 1093 | |
| Property | Number-average molecular weight | | 1.31E+04 | 8.89E+03 | 1.19E+04 | 1.31E+04 | 1.52E+04 |
| | Acid value (mg KOH/g) | | 40.1 | 30.1 | 39.9 | 40.0 | 40.2 |

TABLE 6

| Raw material | | | | Synthetic Example | | | | | | |
|---|---|---|---|---|---|---|---|---|---|---|
| Group | Trade name | Content | | 4-2-1 | 4-2-2 | 4-2-3 | 4-2-4 | 4-2-5 | 4-2-6 | 4-2-7 |
| Group (II) | G-1000 | Nippon Soda Co., Ltd.; 1,2-Poly-butadiene having hydroxyl groups at both ends; Mw = 1548 | Weight of usage (g) | 704.0 | 732.6 | | | | | |
| | GI-1000 | Nippon Soda Co., Ltd.; Hydro-genated 1,2-polybutadiene having hydroxyl groups at both ends; Mw = 1729 | | | | 526.3 | | | | |
| | Poly bd R-15HT | Idemitsu Kosan Co., Ltd.; Poly-butadiene having hydroxyl groups at both ends (1,4-Unit 80%); Mw = 1105 | | | | | | 939.3 | | |
| | Poly IP | Idemitsu Kosan Co., Ltd.; Poly-isoprene having hydroxyl groups at both ends; Mw = 2439 | | | | | | | 780.5 | |
| | SOVERMOL 908 | Cognis Japan Ltd.; Hydro-genated dimer diol; Mw = 537 | | | | | 564.5 | | | |

TABLE 6-continued

| Group | Raw material Trade name | Content | 4-2-1 | 4-2-2 | 4-2-3 | 4-2-4 | 4-2-5 | 4-2-6 | 4-2-7 |
|---|---|---|---|---|---|---|---|---|---|
| | X-22-160AS | Shin-Etsu Chemical Co.; Ltd.; Polysilicone having hydroxyl groups at both ends; Mw = 976 | | | | | | | |
| | KF-6001 | Shin-Etsu Chemical Co., Ltd.; Polysilicone having hydroxyl groups at both ends; Mw = 1840 | | | | | | | 386.3 |
| Carboxyl group-containing diol | Dimethylol butanoic acid | | 148.2 | 128.6 | 85.8 | | | 118.5 | |
| | Dimethylol propionic acid | | | | | 77.8 | 147.5 | | 56.4 |
| Polyisocyanate | DESMODULE-W | Sumika Bayer Urethane Co., Ltd.; Methylene-bis(cyclohexyl isocyanate) | 423.1 | | | 423.5 | | | |
| | DESMODULE-I | Sumika Bayer Urethane Co., Ltd.; Isophorone diisocyanate | | | | | | 434.3 | 140.7 |
| | TEKENATE 600 | Mitsui Takeda Chemicals, Inc.; Cyclohexane-1,3-dimethylene diisocyanate | | | 315.6 | | | | |
| | COSMONATE T-80 | Mitsui Takeda Chemicals, Inc.; Tolylene diisocyanate (TDI); (2,4-/2,6- = 80/20) | | | 174.2 | | | 209.0 | |
| Monohydroxy compound | Isobutanol | Wako Pure Chemical Industries, Ltd. Special grade chemicals | 6.0 | | | 5.9 | 5.0 | | 3.0 |
| | CHDMMA | Nippon Kasei Chemical Co., Ltd.; 1,4-Cyclohexane dimethanol monoacrylate | | | 42.1 | | | 15.9 | |
| | HEA | Osaka Organic Chemial Industry Ltd.; 2-Hydroxyethyl acrylate | | | | 25.8 | | | |
| Solvent | Diethylene glycol ethylether acetate | DAICEL CHEMICAL INDUSTRIES, LTD. | 1293 | 1281 | 812.4 | 1089 | | 1124 | |
| | γ-Butyrolactone | Mitsubishi Chemical Corporation | | | | | 1540 | | 595 |
| Property | Number-average molecular weight | | 1.42E+04 | 1.33E+04 | 1.56E+04 | 1.32E+04 | 1.13E+04 | 1.26E+04 | 1.29E+04 |
| | Acid value (mg KOH/g) | | 49.8 | 40.0 | 39.8 | 29.8 | 40.1 | 39.8 | 41.1 |

TABLE 7

| | | EXAMPLE | | | | | | | | |
|---|---|---|---|---|---|---|---|---|---|---|
| | | 1 | 2 | 3 | 4 | 5 | 6 | 7 | 8 | 9 |
| Urethane resin A | Synthetic Example 1-1 | 100 | | | | | | | | |
| | Synthetic Example 1-2 | | 100 | | | | | | | |
| | Synthetic Example 1-3 | | | 100 | | | | | | |
| | Synthetic Example 1-4 | | | | 100 | | | | | |
| | Synthetic Example 1-6 | | | | | 100 | | | | |

TABLE 7-continued

|  |  |  | | | | | | | | | |
|---|---|---|---|---|---|---|---|---|---|---|---|
|  | Synthetic Example 2-1 |  |  |  |  |  | 100 |  |  |  |  |
|  | Synthetic Example 2-2 |  |  |  |  |  |  | 100 |  |  |  |
|  | Synthetic Example 3-1 |  |  |  |  |  |  |  | 100 |  |  |
|  | Synthetic Example 3-2 |  |  |  |  |  |  |  |  | 100 |  |
|  | Synthetic Example 3-3 |  |  |  |  |  |  |  |  |  |  |
|  | Synthetic Example 4-1-1 |  |  |  |  |  |  |  |  |  |  |
|  | Synthetic Example 4-1-2 |  |  |  |  |  |  |  |  |  |  |
|  | Synthetic Example 4-1-3 |  |  |  |  |  |  |  |  |  |  |
|  | Synthetic Example 4-2-1 |  |  |  |  |  |  |  |  |  |  |
|  | Synthetic Example 4-2-2 |  |  |  |  |  |  |  |  |  |  |
| Curing agent B | Epikote 828 | Japan Epoxy Resins Co., Ltd. |  |  | 7.35 |  |  | 9.63 | 9.63 | 9.63 | 9.63 |
|  | Epikote 834 |  | 9.63 | 9.63 |  |  |  |  |  |  |  |
|  | Epikote 1002 |  |  |  |  | 11.4 |  |  |  |  |  |
|  | Epikote YX-8034 |  |  |  |  |  |  |  |  |  |  |
|  | NC-3000 | Nippon Kayaku CO., LTD. |  |  |  |  |  |  |  |  |  |
| Organic or inorganic fine particle | Aerosil R-974 | NIPPON AEROSIL CO., LTD. | 5 | 5 | 5 | 5 | 5 |  | 5 | 5 | 5 |
|  | Aerosil 200 |  |  |  |  |  |  | 5 |  |  |  |
|  | Aerosil OX50 |  |  |  |  |  |  | 10 |  |  |  |
|  | Barium sulfate B-34 | Sakai Chemical Industry Co., Ltd. | 10 | 10 | 10 | 10 | 10 |  | 10 | 10 | 10 |
|  | Silicone resin powder X-52-854 | Shin-Etsu Chemical Co., Ltd. | 10 | 10 | 10 | 10 | 10 | 10 | 10 | 10 | 10 |
| Curing catalyst | Melamine | | 1 | 1 | 1 | 1 | 1 | 1 | 1 | 1 | 1 |
|  | CUREZOL 1B2MZ | Shikoku Corp. |  |  |  |  |  |  |  | 1 |  |
| Anti-foaming | KS-66 | Shin-Etsu Chemical Co., Ltd. | 1.5 | 1.5 | 1.5 | 1.5 | 1.5 | 1.5 | 1.5 | 1.5 | 1.5 |
|  | Tackiness at high temperature | | >100° C. | >100° C. | >100° C. | >100° C. | >100° C. | >100° C. | >100° C. | >100° C. | >100° C. |
|  | Adhesion | | 100/100 | 100/100 | 100/100 | 100/100 | 100/100 | 100/100 | 100/100 | 100/100 | 100/100 |
|  | Warpage | | AA | AA | AA | AA | AA | AA | AA | AA | AA |
|  | Flexibility | | AA | AA | AA | AA | AA | AA | AA | AA | AA |
|  | Plating resistance | | BB | BB | AA | BB | BB | BB | BB | BB | BB |
|  | Soldering heat resistance | | AA | AA | AA | AA | AA | AA | AA | AA | AA |
|  | Reliability of electric insulation | | AA | AA | AA | AA | AA | AA | AA | AA | AA |

|  |  |  | EXAMPLE | | | | | | Comp. Ex. | |
|---|---|---|---|---|---|---|---|---|---|---|
|  |  |  | 10 | 11 | 12 | 13 | 14 | 15 | 1 | 2 |
| Urethane resin A | Synthetic Example 1-1 | |  |  |  |  | 20 |  |  |  |
|  | Synthetic Example 1-2 | |  |  |  |  |  |  |  |  |
|  | Synthetic Example 1-3 | |  |  |  |  |  |  |  |  |
|  | Synthetic Example 1-4 | |  |  |  |  |  |  |  |  |
|  | Synthetic Example 1-6 | |  |  |  |  |  |  |  |  |
|  | Synthetic Example 2-1 | |  |  |  |  |  |  |  |  |
|  | Synthetic Example 2-2 | |  |  |  |  |  |  |  |  |
|  | Synthetic Example 3-1 | |  |  |  |  |  | 20 |  |  |
|  | Synthetic Example 3-2 | |  |  |  |  |  |  |  |  |
|  | Synthetic Example 3-3 | | 100 |  |  |  |  |  |  |  |
|  | Synthetic Example 4-1-1 | |  | 90 |  |  | 50 | 50 |  |  |
|  | Synthetic Example 4-1-2 | |  |  | 90 |  |  |  |  |  |
|  | Synthetic Example 4-1-3 | |  |  |  | 60 |  |  | 100 |  |
|  | Synthetic Example 4-2-1 | |  |  | 10 | 10 |  |  |  |  |
|  | Synthetic Example 4-2-2 | |  |  |  | 40 | 30 | 30 |  | 100 |
| Curing agent B | Epikote 828 | Japan Epoxy Resins Co., Ltd. |  |  |  |  |  |  |  |  |
|  | Epikote 834 | | 9.63 | 7.7 | 6.37 | 9.63 | 9.63 | 9.63 | 9.63 | 9.63 |
|  | Epikote 1002 | |  |  |  |  |  |  |  |  |
|  | Epikote YX-8034 | |  |  |  |  |  |  |  |  |
|  | NC-3000 | Nippon Kayaku CO., LTD. |  |  |  |  |  |  |  |  |
| Organic or inorganic fine particle | Aerosil R-974 | NIPPON AEROSIL CO., LTD. | 5 | 5 | 5 | 5 | 5 | 5 | 5 | 5 |
|  | Aerosil 200 | |  |  |  |  |  |  |  |  |
|  | Aerosil OX50 | |  |  |  |  |  |  |  |  |
|  | Barium sulfate B-34 | Sakai Chemical Industry | 10 | 10 | 10 | 10 | 10 | 10 | 10 | 10 |

TABLE 7-continued

|  |  |  |  |  |  |  |  |  |  |  |
|---|---|---|---|---|---|---|---|---|---|---|
|  | Silicone resin powder X-52-854 | Shin-Etsu Chemical Co., Ltd. | 10 | 10 | 10 | 10 | 10 | 10 | 10 | 10 |
| Curing catalyst | Melamine CUREZOL 1B2MZ | Shikoku Corp. | 1 | 1 | 1 | 1 | 1 | 1 | 1 | 1 |
| Anti-foaming | KS-66 | Shin-Etsu Chemical Co., Ltd. | 1.5 | 1.5 | 1.5 | 1.5 | 1.5 | 1.5 | 1.5 | 1.5 |
|  | Tackiness at high temperature |  | >100° C. | >100° C. | >100° C. | >100° C. | >100° C. | >100° C. | 30° C. | 60° C. |
|  | Adhesion |  | 100/100 | 100/100 | 100/100 | 100/100 | 100/100 | 100/100 | 100/100 | 40/100 |
|  | Warpage |  | AA | AA | AA | AA | AA | AA | AA | CC |
|  | Flexibility |  | AA | AA | AA | AA | AA | AA | AA | AA |
|  | Plating resistance |  | BB | BB | BB | AA | AA | AA | CC | AA |
|  | Soldering heat resistance |  | AA | AA | AA | AA | AA | AA | AA | AA |
|  | Reliability of electric insulation |  | AA | AA | AA | AA | AA | AA | AA | CC |

INDUSTRIAL APPLICABILITY

As mentioned above, the present invention can provide a thermosetting resin composition capable of giving cured products excellent in adhesion with substrates, low warpage, flexibility, plating resistance, solder heat resistance, and long-term reliability at high temperature and high humidity, especially in low tackiness at high temperature. Therefore, the thermosetting resin composition of the present invention can find uses in the fields such as heat-curable resins with superior flexibility for overcoating flexible circuits, electrical insulating materials such as heat-curable solder resists and interlayer insulation materials with superior insulating properties, IC and SLSI encapsulating materials, and laminates.

The thermosetting resin composition of the present invention can produce overcoating agents more inexpensively than the conventional liquid polyimide ink. In addition, it was difficult for the conventional surface protection film to have both the adhesion strength and long-term reliability of electric insulation and the low tackiness at high temperature, while according to the present invention, such an overcoating agent that can give a protection film with low tackiness at high temperature, no trouble making in packaging processes, an excellent adhesion strength and long-term reliability of the electric insulation can be provided.

The invention claimed is:

1. A thermosetting resin composition comprising
(A) a carboxyl group-containing urethane resin prepared by using
(a) a polyisocyanate compound,
(b) polyol compounds, and
(c) a carboxyl group-containing dihydroxy compound,
(B) a curing agent,
wherein the polyol compounds (b) are one or more polyol compound(s) selected from Group (I) and one or more polyol compound(s) selected from Group (II);
Group (I): polycarbonate polyol, polyether polyol, polyester polyol, and polylactone polyol,
Group (II): polybutadiene polyol, polysilicone having hydroxyl groups at both ends, polyol having 18 to 72 carbon atoms and oxygen atoms present only in hydroxyl groups;
wherein the carboxyl group-containing urethane resin (A) is selected from the group consisting of the following (i) to (iii):

(i) a mixture of a urethane resin prepared by using the polyol compounds of Group (I) and a urethane resin prepared by using the polyol compounds of Group (II),
(ii) a block urethane resin obtained by the reaction of one urethane resin having terminal isocyanate groups prepared by using polyol compound of either Group (I) or Group (II) and another urethane resin having terminal hydroxyl groups prepared by using the other polyol compound with each other, and
(iii) a carboxyl group-containing urethane resin obtained by starting a reaction using the polyisocyanate compound with a first polyol compound of either Group (I) or Group (II) and, after a conversion of the hydroxyl group of the polyol compound becomes 50% or more, further reacting the polyisocyanate compound with the other polyol compound of either Group (I) or Group (II), wherein the other polyol compound is from the group that is different from the first polyol compound; and
wherein the curing agent (B) is an epoxy compound having two or more epoxy groups per molecule.

2. The thermosetting resin composition according to claim 1, wherein the carboxyl group-containing urethane resin (A) is prepared by further using (d) a monohydroxy compound.

3. The thermosetting resin composition according to claim 2, wherein the monohydroxy compound (d) is at least one compound selected from the group consisting of methanol, ethanol, n-propanol, isopropanol, n-butanol, isobutanol, sec-butanol, and tert-butanol.

4. The thermosetting resin composition according to claim 1, wherein the carboxyl group-containing urethane resin (A) is prepared by further using (e) a monoisocyanate compound.

5. The thermosetting resin composition according to claim 1, wherein the polyol compounds (b) are selected from the polyol compounds of Group (I) and Group (II) at a weight ratio (Group (I)/Group (II)) of 1/50 to 50/1.

6. The thermosetting resin composition according to claim 1, wherein the polyisocyanate compound (a) is at least one compound selected from the group consisting of 1,4-cyclohexane diisocyanate, isophorone diisocyanate, methylenebis (4-cyclohexyl-isocyanate), hydrogenated 1,3-xylene diisocyanate, and hydrogenated 1,4-xylylene diisocyanate.

7. The thermosetting resin composition according to claim 1, wherein the carboxyl group-containing dihydroxy compound (c) is 2,2-dimethylolpropionic acid and/or 2,2-dimethylolbutanoic acid.

8. The thermosetting resin composition according to claim 1, wherein the carboxyl group-containing urethane resin (A)

has a number-average molecular weight in the range of 1,000 to 100,000, and an acid value in the range of 5 to 120 mg KOH/g.

9. The thermosetting resin composition according to claim 1, wherein the carboxyl group-containing urethane resin (A) has a number-average molecular weight in the range of 3,000 to 50,000, and an acid value in the range of 10 to 70 mg KOH/g.

10. The thermosetting resin composition according to claim 1, wherein the curing agent (B) is a bisphenol A epoxy resin, a bisphenol F epoxy resin, a hydrogenated bisphenol A epoxy resin or a hydrogenated bisphenol F epoxy resin.

11. The thermosetting resin composition according to claim 1, wherein the curing agent (B) is an alicyclic epoxy compound.

12. The thermosetting resin composition according to claim 1, wherein the carboxyl group-containing urethane resin (A) is produced in the presence of solvent and has a micro-phase separation structure after the solvent evaporation and curing.

13. A thermosetting resin composition solution comprising the thermosetting resin composition according to claim 1 and a solvent (c) having a boiling point of 110° C. or higher and having no basic functional group.

14. The thermosetting resin composition solution according to claim 13, wherein the solvent (c) is selected from the group consisting of toluene, xylene, ethyl benzene, nitrobenzene, isophorone, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, n-butyl acetate, isoamyl acetate, ethyl lactate, cyclohexanone, N,N-dimethylformamide, N,N-dimethylacetamide, N-methylpyrrolidone, γ-butyrolactone and dimethylsulfoxide.

15. The thermosetting resin composition solution of claim 13, wherein the carboxyl group-containing urethane resin (A) is contained at a solid concentration of 30 to 80% by mass.

16. A film forming material comprising the thermosetting resin composition according to claim 1, and an inorganic and/or organic particle (D).

17. A film forming material comprising the thermosetting resin composition according to claim 1, and an anti-foaming agent (E).

18. A cured product formed from the thermosetting resin composition according to claim 1.

* * * * *